United States Patent
Kubo et al.

(10) Patent No.: US 10,784,295 B2
(45) Date of Patent: Sep. 22, 2020

(54) IMAGE CAPTURING APPARATUS AND METHOD FOR CONTROLLING TEMPERATURE OF A LIGHT TRANSMITTING ELEMENT THROUGH CONTROLLING THE OPTICAL ELEMENT'S EXPOSURE TO AND TRANSMITTANCE OF LIGHT

(71) Applicant: CANON KABUSHIKI KAISHA, Tokyo (JP)

(72) Inventors: Wataru Kubo, Inagi (JP); Kosuke Kiyamura, Kawasaki (JP); Kyosuke Sato, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/251,266

(22) Filed: Jan. 18, 2019

(65) Prior Publication Data

US 2019/0229137 A1  Jul. 25, 2019

(30) Foreign Application Priority Data

Jan. 22, 2018  (JP) .................. 2018-008163

(51) Int. Cl.
| | |
|---|---|
| H04N 5/235 | (2006.01) |
| H01L 27/146 | (2006.01) |
| H04N 5/232 | (2006.01) |
| H04N 5/225 | (2006.01) |
| G03B 11/00 | (2006.01) |
| G02B 5/20 | (2006.01) |
| H01L 27/30 | (2006.01) |

(52) U.S. Cl.
CPC ........ *H01L 27/14609* (2013.01); *G02B 5/205* (2013.01); *G03B 11/00* (2013.01); *H01L 27/307* (2013.01); *H04N 5/2253* (2013.01); *H04N 5/2254* (2013.01); *H04N 5/2353* (2013.01); *H04N 5/23229* (2013.01)

(58) Field of Classification Search
CPC . H04N 5/2353; G02B 5/205; H01L 27/14609
USPC ......................................................... 348/362
See application file for complete search history.

(56) References Cited

U.S. PATENT DOCUMENTS

2014/0247386 A1* 9/2014 Takagi .................. G03B 9/02
                                                                  348/362

FOREIGN PATENT DOCUMENTS

JP        2015-004925 A     1/2015

* cited by examiner

*Primary Examiner* — Usman A Khan
(74) *Attorney, Agent, or Firm* — Cowan, Liebowitz & Latman, P.C.

(57) ABSTRACT

An image capturing apparatus comprising: an optical element that changes a transmittance of light; an image sensor; an acquisition unit that acquires information regarding a temperature of the optical element; a first control unit that controls a transmittance of the optical element; and a second control unit that controls exposure when a subject is captured using the image sensor and an image signal is output. The first control unit performs control so as to increase a target transmittance of the optical element in a first condition under which a temperature of the optical element exceeds a predetermined temperature, based on the information regarding the temperature, and the second control unit controls exposure excluding the transmittance according to a change in the transmittance of the optical element in the first condition.

7 Claims, 18 Drawing Sheets

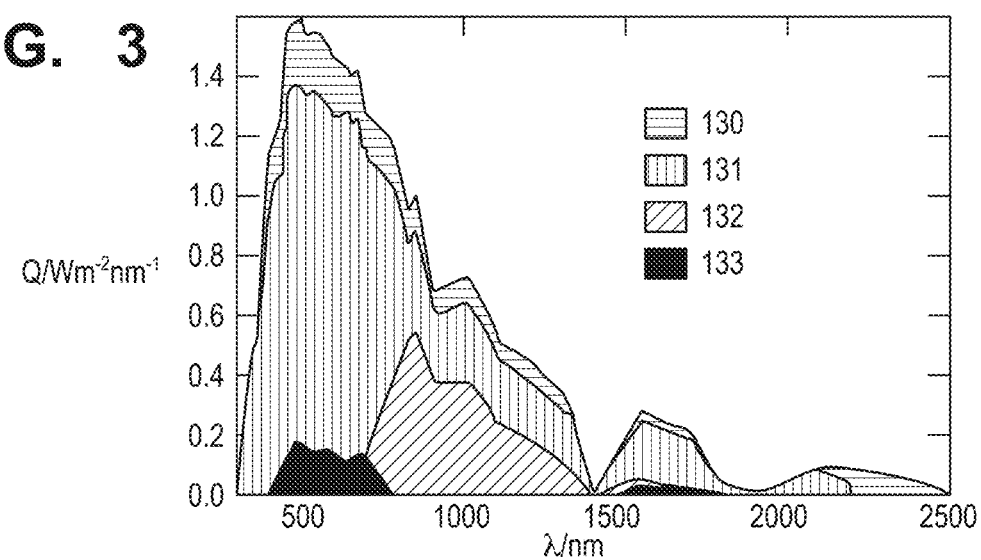
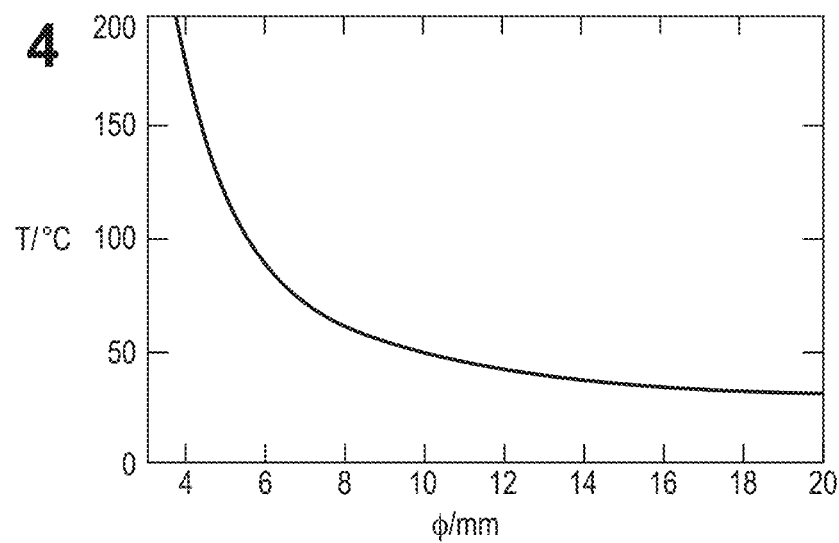
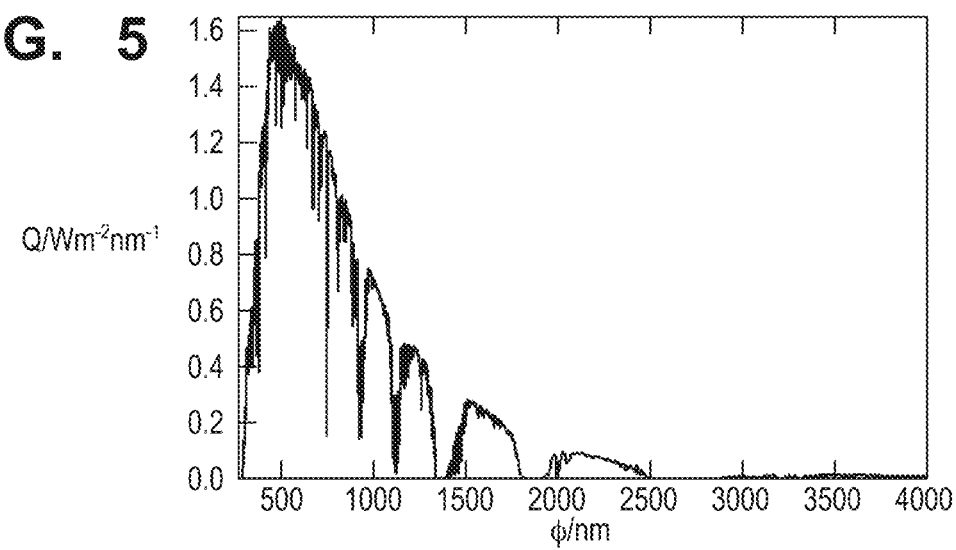

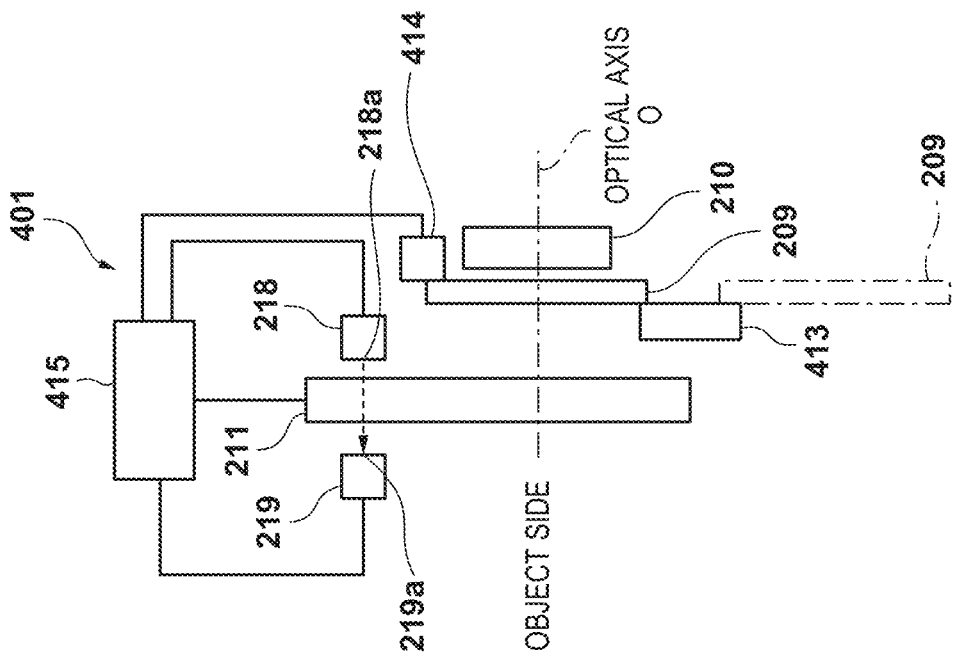
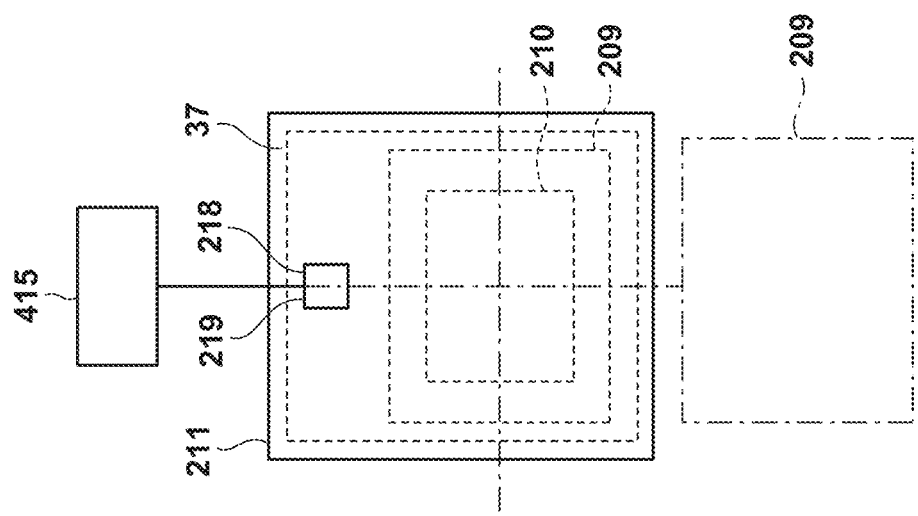

FIG. 20B

( DENSITY DEVIATION ESTIMATION START )

↓

CALCULATE OVERALL EXPOSURE VALUE OF FIRST AND SECOND IMAGES — S511

↓

CALCULATE DIFFERENCE BETWEEN EXPOSURE VALUES — S512

↓

CONVERT TO DENSITY DIFFERENCE — S513

↓

CALCULATE DENSITY DEVIATION CORRECTION AMOUNT — S514

↓

( DENSITY DEVIATION ESTIMATION END )

FIG. 20C

( EXPOSURE ERROR DETECTION START )

↓

DIVIDE FIRST AND SECOND IMAGES INTO REGIONS — S521

↓

CALCULATE EXPOSURE FOR EACH REGION — S522

↓

CALCULATE EXPOSURE DIFFERENCE FOR EACH REGION — S523

↓

( EXPOSURE ERROR DETECTION END )

FIG. 21

| STEP | LIGHT TRANSMITTANCE CHANGEABLE ELEMENT (DESIGNATION VALUE) | FIRST IMAGE (PRESUMED STATE) | LIGHT TRANSMITTANCE CHANGEABLE ELEMENT (ACTUAL STATE) (=1940) | FIRST IMAGE (ACTUAL STATE) (=1911a) | SECOND IMAGE (ACTUAL STATE) (=1911a) |
|---|---|---|---|---|---|
| S501 | T=100% | | T=100% ±0% | EV+1 <br> 2110a | EV+1 <br> 2110b |
| S502 | T=55% | EV±0 <br> 2101a | T=70% ±a% | EV+0.5 ±a <br> 2011a | EV±0 <br> 2011b |
| S504 ~ S505 | | ΔT=20% | | ΔEV₁ Approx. 0.5 | |
| S506 | T=35% | | T=58% ±β% | EV+0.1 ±β' <br> 2112a | EV±0 <br> 2112b |
| S507 | | | | ΔEV₂ 0.1±β' | |
| S508 | | | | EV±0 ±0 <br> 2113a | |

IMAGE CAPTURING APPARATUS AND METHOD FOR CONTROLLING TEMPERATURE OF A LIGHT TRANSMITTING ELEMENT THROUGH CONTROLLING THE OPTICAL ELEMENT'S EXPOSURE TO AND TRANSMITTANCE OF LIGHT

BACKGROUND OF THE INVENTION

Field of the Invention

The present invention relates to an image capturing apparatus, a method for controlling the same, and an accessory, and more specifically to an image capturing apparatus including an optical element configured to change the transmittance of light, a method for controlling the same, and an accessory.

Description of the Related Art

Conventionally, light transmittance changeable elements which reduce the light transmittance by electrically controlling the transmittance of the elements, such as ND filters that reduce light incident on an image sensor in an image capturing device, are known. Using such a light transmittance changeable element increases the degree of freedom in exposure adjustment, and expression that is difficult with an element for which a fixed transmittance becomes possible. The light transmittance changeable element is capable of performing more effective light amount adjustment by increasing the range of change in the transmittance. For example, a light transmittance changeable element with a wide range of change in the transmittance reduces the transmittance so as to attenuate strong incident light, prevents signals of the image sensor from being saturated, and thus an image for which gradation is retained can be obtained.

Elements in which organic molecules are used, such as a liquid crystal element, and an organic electrochromic (EC) device, have been developed as the light transmittance changeable element. These elements do not require mechanical operating units, and are capable of continuously electrically controlling the light transmittance. For example, the transmittance is determined by an electrochemical reaction amount of a material used in an EC device in the light transmittance control using the EC device, and thus a reaction amount for achieving a desired transmittance can be adjusted by the electric control (applying a voltage).

On the other hand, the EC device is an element associated with movement of organic molecules, and thus operations in temperature change, in particular, operations at high temperature, are problematic. That is, light absorbed by the light transmittance changeable element when the incident light is attenuated is converted into heat, and the temperature of the device increases. In particular, if the incident light is strong and the transmittance is low (=high light absorption rate), a large amount of heat is absorbed, the temperature of the light transmittance changeable element significantly increases, and characteristics of a change in the transmittance of the light transmittance changeable element become unstable.

To address this problem. Japanese Patent Laid-Open No. 2015-4925 discloses that the control as will be described below is performed such that light attenuation characteristics do not change due to heat generated by the incident light in an image capturing device having a physical diaphragm whose characteristics change under heat. That is, the light attenuation amount of light incident on an image sensor from an optical member is calculated, and the transmittance of the physical diaphragm is controlled based on the light attenuation amount.

However, with the technique proposed in Japanese Patent Laid-Open No. 2015-4925, when an image is acquired, the influence of change in the transmittance is reflected in the image. As a result, there is a risk that the acquired image has unnatural brightness.

SUMMARY OF THE INVENTION

The present invention has been made in consideration of the above situation, and suppresses a change in the characteristics of the light transmittance changeable element that is caused by an increase in the temperature, and reduces an influence on an image to be acquired.

According to the present invention, provided is an image capturing apparatus comprising: an optical element that changes a transmittance of light; an image sensor that photoelectrically convert light that has passed through the optical element into an electric signal and outputs the electric signal as an image signal; and at least one processor or circuit that functions as following units; an acquisition unit that acquires information regarding a temperature of the optical element; a first control unit that controls a transmittance of the optical element; and a second control unit that controls exposure when a subject is captured using the image sensor and an image signal is output, wherein the first control unit performs control so as to increase a target transmittance of the optical element in a first condition under which a temperature of the optical element exceeds a predetermined temperature, based on the information regarding the temperature, and wherein the second control unit controls exposure excluding the transmittance according to a change in the transmittance of the optical element in the first condition.

Further, according to the present invention, provided is an image capturing apparatus comprising: an optical element that changes a transmittance of light; an image sensor that photoelectrically converts light that has passed through the optical element into an electric signal and outputs the electric signal as an image signal; a measurement unit that measures a transmittance of the optical element; and a controller that controls the transmittance of the optical element based on the transmittance measured by the measurement unit.

Furthermore, according to the present invention, provided is an image capturing apparatus comprising: an optical element that changes a transmittance of light; a first image sensor that photoelectrically converts light that has passed through the optical element into an electric signal and outputs the electric signal as a first image signal; a second image sensor that photoelectrically converts light that does not pass through the optical element into an electric signal and outputs the electric signal as a second image signal; and a correction unit that corrects the first image signal of each of divided regions obtained by dividing the first image signal into a plurality of regions based on a difference for each divided region between an average exposure value of each divided region of the first signal and an average exposure value of each divided region obtained by dividing the second image signal into a plurality of regions.

Further, according to the present invention, provided is an accessory that is attachable to and detachable from an image capturing apparatus including an image sensor, the accessory comprising: an optical element that changes a transmittance of light, wherein the image sensor is capable of photoelectrically converting light that has passed through the optical element into an electric signal and outputting the electric signal as an image signal, and exposure excluding the transmittance is controlled in accordance with a change in a target transmittance of the optical element in a first condition under which a temperature of the optical element exceeds a predetermined temperature.

Further, according to the present invention, provided is a method for controlling an image capturing apparatus including an optical element that changes a transmittance of light, an image sensor that photoelectrically converts light that has passed through the optical element into electric signal and outputs the electric signal as an image signal, and an acquisition unit that acquire information regarding a temperature of the optical element, the method comprising: performing control so as to increase a target transmittance of the optical element in a first condition under which a temperature of the optical element exceeds a predetermined temperature, based on the information regarding the temperature, and controlling exposure excluding the transmittance according to a change in the transmittance of the optical element in the first condition.

Further, according to the present invention, provided is a method for controlling an image capturing apparatus including an optical element that changes a transmittance of light, an image sensor that photoelectrically converts light that has passed through the optical element into an electric signal and outputs the electric signal as an image signal, and a measurement unit that measures a transmittance of the optical element, the method comprising: controlling a transmittance of the optical element based on the transmittance measured by the measurement unit.

Further, according to the present invention, provided is a method for controlling an image capturing apparatus including an optical element that changes a transmittance of light, a first image sensor that photoelectrically converts light that has passed through the optical element into an electric signal and outputs the electric signal as a first image signal, and a second image sensor that photoelectrically convert light that does not pass through the optical element into an electric signal and outputs the electric signal as a second image signal, the method comprising: controlling a transmittance of the optical element based on a difference between an average exposure value of the first image signal and an average exposure value of the second image signal.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 3 is a diagram illustrating an example of calculation of an amount of incident light using a spectral shape of the incident light.

FIG. 4 is a diagram showing relationship between a condensing diameter and a temperature on a light transmittance changeable element.

FIG. 5 is a diagram showing a spectrum of reference sunlight.

FIGS. 16A and 16B are schematic diagrams showing a light transmittance changeable element, an IR cut filter, and an image sensor according to a fourth embodiment.

FIGS. 20A to 20C are flowcharts illustrating a correction method according to the fifth embodiment.

FIG. 21 is a diagram illustrating the situation in which exposure unevenness and an exposure deviation of the first image are corrected using the correction method according to the fifth embodiment.

DESCRIPTION OF THE EMBODIMENTS

Exemplary embodiments of the present invention will be described in detail in accordance with the accompanying drawings. The dimensions, materials, shapes and relative positions of the constituent parts shown in the embodiments should be changed as convenient depending on various conditions and on the structure of the apparatus adapted to the invention, and the invention is not limited to the embodiments described herein.

First Embodiment

Figure 1:
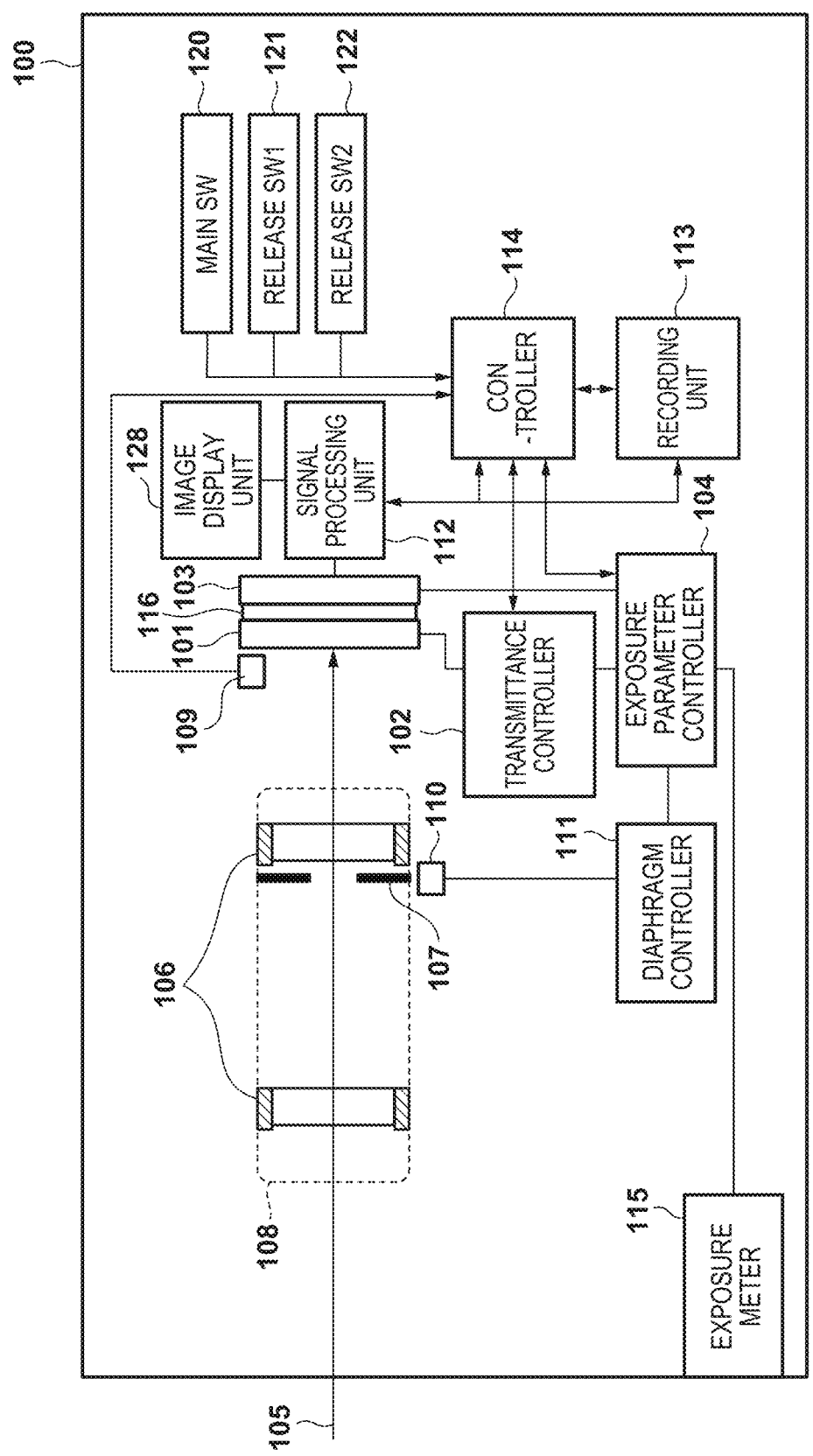
FIG. 1 is a block diagram showing a schematic configuration of an image capturing apparatus according to a first embodiment of the present invention.

FIG. 1 is a block diagram showing a schematic configuration of an image capturing apparatus 100 according to the first embodiment of the present invention.

In FIG. 1, light 105 from a subject (referred to as "subject light" hereinafter) that is incident on the image capturing apparatus 100 passes through an imaging optical system 108 including a plurality of lenses 106 for forming an image of the subject on an image sensor 103 and a diaphragm 107 that limits the incident light amount. Furthermore, the subject light 105 passes through a light transmittance changeable element 101 and an IR filter 116, and forms an image on the image sensor 103 constituted by a CMOS sensor, a CCD sensor, and the like.

The transmittance of the light transmittance changeable element 101 can be controlled by an electrical signal, and functions to control the amount of the light to be incident on the image sensor 103. An element in which organic molecules are used, such as a liquid crystal element or an organic electrochromic device, may be used as the light transmittance changeable element 101. Among these elements, guest-host liquid crystal elements and organic electrochromic devices have an advantage in terms of contrast and polarization characteristics, and from the viewpoint of contrast and maximum transmittance, organic electrochromic (EC) devices are advantageous. Note that a configuration example of the organic EC device used as the light transmittance changeable element 101 will be described later in detail. A transmittance controller 102 controls the transmittance of the light transmittance changeable element 101.

In the image sensor 103, the incident subject light 105 is converted into an image signal having information regarding the incident subject light 105 (color, distribution of the intensity, and the like) and output. Then, various processes including processing for converting the image signal into a standard video signal or the like are performed on the image signal output from the image sensor 103 in a signal processing unit 112, for example, and the resulting signal is recorded in a recording medium (not shown) by a recording unit 113, or displayed on an image display unit 128.

When changing the transmittance of the light transmittance changeable element 101, an exposure parameter controller 104 functions to synchronously adjust exposure parameters and reduce the influence of a change in the transmittance on an image acquired in the image sensor 103. Herein, examples of the exposure parameters to be adjusted include a shutter speed, an aperture, and an ISO sensitivity (gain). Also, this exposure parameter controller 104 may have a function of performing manual or automatic control such that the exposure parameters achieve a desired exposure, according to the result measured by an exposure meter 115. Also, in the first embodiment, the exposure parameter controller 104 has the function of performing synchronous control using exposure parameters in response to a change in the transmittance of the light transmittance changeable element 101, which will be described later.

The diaphragm 107 is controlled by a diaphragm controller 111 and a diaphragm driving unit 110 based on an exposure value obtained by the exposure parameter controller 104 based on a photometric value obtained by the exposure meter 115.

A temperature information acquisition unit 109 acquires information regarding the temperature of the light transmittance changeable element 101.

Note that a method for acquiring the temperature information using the temperature information acquisition unit 109 will be described later in detail.

Also, the image capturing apparatus 100 includes a main switch (switch is referred to as "SW" hereinafter) 120, a release SW1 (121), and a release SW2 (122). The main SW 120 is a switch for turning on or off a main power of the image capturing apparatus 100, the release SW1 (121) is a switch for instructing the image capturing apparatus 100 to prepare for imaging which involves photometry and focus adjustment processing and the like, and the release SW2 is a switch for instructing the image capturing apparatus 100 to start or stop imaging. The recording unit 113 is an apparatus configured to record image signals and the like that have undergone conversion processing.

The controller 114 is constituted by a CPU, a ROM, a RAM, and the like, and collectively controls the overall operations of the image capturing apparatus 100. Note that the controller 114 may also be constituted integrally with the transmittance controller 102, the exposure parameter controller 104, the temperature information acquisition unit 109, and the like of the light transmittance changeable element 101.

The image display unit 128 is constituted by a TFT-LCD and the like, for example, and image data for display is displayed on the image display unit 128 through processing by the signal processing unit 112. An electronic viewfinder (EVF) function can be realized by successively displaying captured image data on the image display unit 128.

Note that in the description of the first embodiment hereinafter, in the image capturing apparatus 100 having the above-described configuration, an element (the imaging optical system 108) that is located closer to the subject on the light path than the light transmittance changeable element 101 and reduces the subject light 105 that is incident on the image capturing apparatus 100 before the subject light 105 is incident on the light transmittance changeable element 101 is referred to as a "front light transmission reducing element 108". Also, an element (the IR filter 116) that is located closer to an image forming plane on the light path than the light transmittance changeable element 101 and reduces the subject light 105 that has passed through the light transmittance changeable element 101 before the subject light 105 is incident on the image sensor 103 is referred to as a "post light transmission reducing element 116".

Configuration of Organic Electrochromic (EC) Device

Figure 2A:
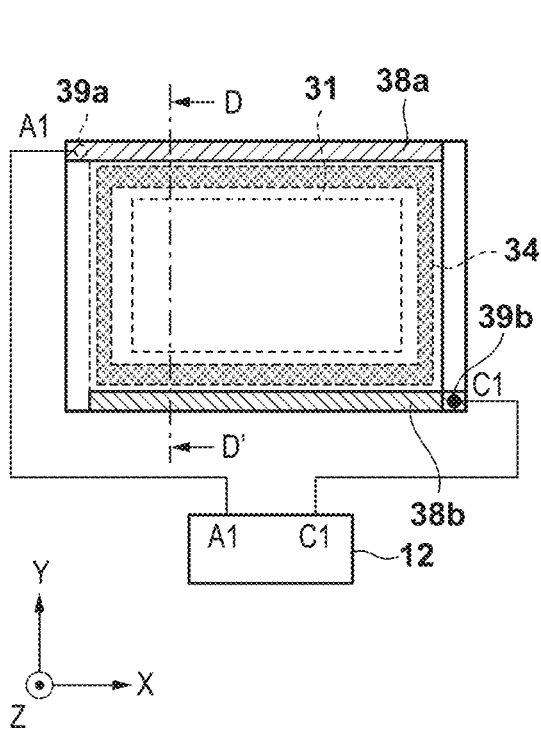
FIGS. 2A to 2D are illustrative diagrams of an organic electrochromic device.
Figure 2B:
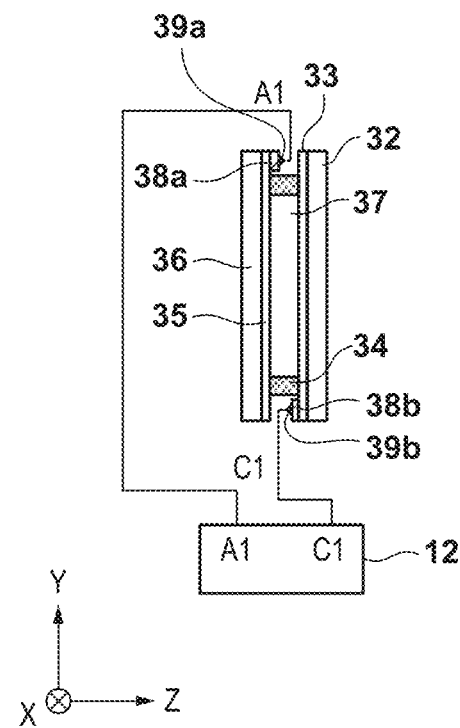

Herein, a configuration example of an organic electrochromic (EC) device used as the light transmittance changeable element 101 that is a characteristic portion of the image capturing apparatus 100 will be described. FIGS. 2A to 2D are schematic diagrams showing a configuration example of the organic EC device. FIG. 2A is a diagram showing the organic EC device when the outer shape of the device is approximately a quadrangle. Note that the long-side direction of the organic EC device is defined as an X-axis, the short-side direction is defined as a Y-axis, and the depth direction of the drawing is defined as a Z-axis in FIG. 2A. FIG. 2B is a cross-sectional view taken along the line D-D' in FIG. 2A, viewed from the X-axis direction.

Note that the Y-axis expresses the gravity direction and the Z-axis expresses the optical axis direction in the so-called landscape orientation of the image capturing apparatus 100. On the other hand, the X-axis expresses the gravity direction in the so-called portrait orientation of the image capturing apparatus 100. Thus, the gravity direction varies between the Y-axis and the X-axis according to the imaging orientation of the image capturing apparatus 100. Hereinafter, essentially, the case of the landscape orientation, that is, the case where the Y-axis expresses the gravity direction will be described.

In FIGS. 2A to 2D, reference numeral 31 indicates an effective light beam region of the organic EC device through which the imaging luminous flux passes, reference numerals 32 and 36 indicate transparent substrates, and reference numerals 33 and 35 indicate transparent electrodes that are respectively provided on the transparent substrates 32 and 36. Reference numeral 34 indicates a spacer, and the transparent substrates 32 and 36 and the transparent electrodes 33 and 35 are attached via the spacer 34 such that the transparent substrates 32 and 36 face each other and the transparent electrodes 33 and 35 face each other. An organic EC layer 37 is provided in a gap formed by this pair of transparent electrodes 33 and 35 and the spacer 34.

The spacer 34 adjusts the thickness of the organic EC layer 37 by adjusting the width of the space between the transparent electrodes 33 and 35 of the organic EC device. Also, the spacer 34 is arranged so as to surround the transparent electrodes 33 and 35 while avoiding the effective light beam region 31. In such a case, the spacer 34 may also function as a sealing member such that a solution containing the organic EC material does not leak to the outside. Also, if there is no need to worry about unevenness in the amount of the transmitted light on the surfaces of the transparent electrodes 33 and 35 (that is, tolerance to unevenness in the amount of the transmitted light on the surfaces of the transparent electrodes 33 and 35 is high), the spacer 34 may be arranged in a portion of the light path of the electrodes. An example of such a case is the case where the effective light beam region of the organic EC device 31 is sufficiently large with respect to the image sensor 103, and unevenness resulting from the spacer 34 being arranged has little influence. The spacer 34 is preferably tolerant to the solution in which the organic EC material is dissolved.

Examples of a suitable material of the spacer include resin materials such as various general purpose known plastics, engineer plastics, and super engineering plastics. Also, examples of the material of the spacer include various ceramic materials such as glass, alumina, zirconia, ferrite, forsterite, zircon, steatite, aluminum nitride, silicon nitride, and silicon carbide. Also, examples thereof include various metal materials.

Low-resistance wires 38a and 38b are arranged so as to respectively face the transparent electrodes 33 and 35 across the effective light beam region 31, and have lower resistances than the transparent electrodes 33 and 35. In FIGS. 2A to 2D, a low-resistance wire provided in the transparent electrode 35 is expressed as the low-resistance wire 38a, and a low-resistance wire provided in the transparent electrode 33 is expressed as the low-resistance wire 38b. Power supply terminals 39a and 39b are formed to respectively have contact points with the low-resistance wires 38a and 38b, and are connected to a transmitted light amount operation unit 12. Similarly to the low-resistance wires 38a and 38b, a power supply terminal provided on the transparent electrode 35 is expressed as the power supply terminal 39a, and a power supply terminal provided on the transparent electrode 33 is expressed as the power supply terminal 39b. A driving voltage is applied to the transparent electrodes 33 and 35 through the power supply terminals 39a and 39b and the low-resistance wires 38a and 38b via the transmitted light amount operation unit 12. The transmitted light amount operation unit 12 includes at least a waveform generation circuit for generating any driving voltage waveform, a relay, and a switch circuit for reversing the polarity between the terminals (not shown). Also, the transmitted light amount operation unit 12 may further include peripheral apparatuses such as a power source and a regulator. Also, the transmitted light amount operation unit 12 may include a circuit mechanism for measuring an electric current or charge generated in an electrochemical reaction.

The organic EC layer 37 contains at least one or more anodic organic EC materials or at least one or more cathodic organic EC materials. Hereinafter, a material containing one or more anodic organic EC materials or one or more cathodic organic EC materials is defined as the organic EC material. By applying a voltage across the transparent electrodes 33 and 35, an electrochemical reaction occurs in the organic EC material.

Figure 2C:
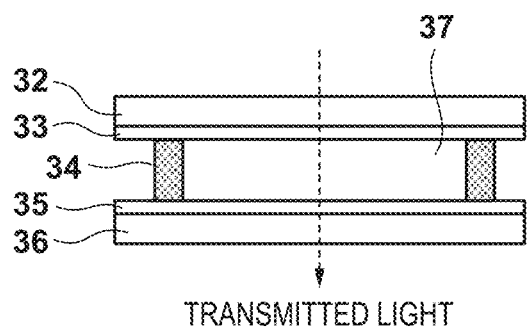

In general, the organic EC material is in a neutral state when a voltage is not applied, and does not have the characteristic of absorbing light in a visible light region. FIG. 2C shows a decolored state. In such a decolored state, the organic EC material has no color and does not absorb light in a visible light region resulting from coloring, and thus the organic EC device exhibits high transmittance.

Figure 2D:
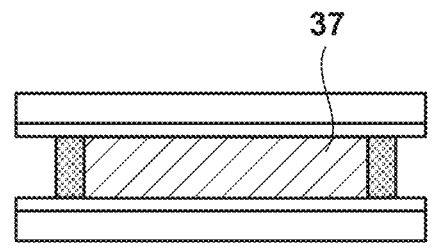

When a voltage is applied across the transparent electrodes 33 and 35, an electrochemical reaction occurs in the organic EC material, and the organic EC material enters an oxidation state (cation) or a reduction state (anion) from the neutral state. The organic EC material has the characteristic of absorbing light in the visible light region in a cation or anion state, and is colored. FIG. 2D shows a colored state. FIG. 2D shows a state in which the organic EC layer 37 is fully colored in the thickness direction. In such a colored state, absorption occurs in the visible light region, and thus the light transmittance of the organic EC device decreases. Also, as a viologen-based material, a material that forms a transparent dication structure in the initial state, forms radical species through a one-electron reduction so as to be colored is also used.

Hereinafter, a description will be given where the light transmittance of the organic EC device is substituted with the absorbance of the organic EC device. Note that the transmittance and the absorbance have the relationship −log (transmittance)=(absorbance), and the absorbance increases by approximately 0.3 each time the transmittance is halved.

If the organic EC device is used in a light-adjustment element, it is preferable to keep high transmittance in the decolored state in order to reduce the influence on the optical system. Thus, the transparent substrates 32 and 36 are preferably transparent substrates that sufficiently transmit visible light, and in general, a glass material is used, and optical glass substrates such as Corning #7059 and BK-7 may be suitably used. Also, materials such as plastic and ceramic may be used as appropriate as long as they have sufficient transparency. A material that is rigid and is unlikely to warp is preferable as the material of the transparent substrates 32 and 36. Also, the material more preferably has little flexibility as a substrate. In general, the thickness of the transparent substrates 32 and 36 is several tens μm to several mm.

Also, the transparent electrodes 33 and 35 are preferably transparent electrodes that sufficiently transmit visible light, and are more preferably made of a material having high conductivity and high optical transparency in the visible light region. Examples of an electrode material include metal and metal oxides such as indium tin oxide alloys (ITO), tin oxide (NESA), indium zinc oxide (IZO), silver oxide, vanadium oxide, molybdenum oxide, gold, silver, platinum, copper, indium, and chromium, silicon-based materials such as polycrystal silicon and amorphous silicon, and carbon materials such as carbon black, graphene, graphite, and glassy carbon.

Also, conductive polymers whose electrical conductivity is increased through doping treatment or the like (for example, polyaniline, polypyrrole, polythiophene, polyacetylene, poly-p-phenylene, or a complex of polyethylene dioxythiophene and polystyrene sulfonic acid (PEDOT: PSS)) may also be suitably used. Of these compounds, ITO, IZO. NESA, PEDOT:PSS, graphene, and the like are particularly preferably used in the organic EC device so that the organic EC device of the present invention has high transmittance in the decolored state. These may be used in various forms such as bulk, microparticles, or the like. Note that these electrode materials may be used alone or in combination.

Furthermore, the organic EC layer 37 is preferably obtained by dissolving electrolytes and an organic EC material such as a low molecular organic material in a solvent.

There is no particular limitation on the solvent as long as the electrolytes can be dissolved therein, and a solvent with polarity is particularly preferable. Specific examples include water and organic polar solvents such as methanol, ethanol, propylene carbonate, ethylene carbonate, dimethyl sulfoxide, dimethoxyethane, acetonitrile, γ-butyrolactone, γ-valerolactone, sulfolane, dimethylformamide, tetrahydrofuran, propionitrile, dimethylacetoamide, methylpyrrolidinone, and dioxolane.

Although there is no particular limitation on the electrolyte as long as it is an ionically dissociative salt that has good solubility and includes cations or anions having electron donative properties to the extent that the coloring of the organic EC material can be ensured, examples thereof include various inorganic ion salts such as alkali metal salts and alkaline earth metal salts, quaternary ammonium salts, and cyclic quaternary ammonium salts. Specific examples include salts of alkali metals of Li, Na, and K such as $LiClO_4$, $LiSCN$, $LiBF_4$, $LiAsF_6$, $LiCF_3SO_3$, $LiPF_6$, $LiI$, $NaI$, $NaSCN$, $NaClO_4$, $NaBF_4$, $NaAsF_6$, $KSCN$, and $KCl$, and quaternary ammonium salts and cyclic quaternary ammonium salts such as $(CH_3)_4NBF_4$, $(C_2H_5)_4NBF_4$, $(n-C_4H_9)_4NBF_4$, $(C_2H_5)_4NBr$, $(C_2H_5)_4NClO_4$, and $(n-C_4H_9)_4NClO_4$. Structures such as $ClO_4^-$, $CF_3SO_3^-$, $BF_4^-$, $PF_6^-$, and $(CF_3SO_2)_2N-$ that are generally known are used as the anion species. Also, an ionic liquid may be used. These electrolyte materials may be used alone or in combination.

Any organic EC materials may be used as long as they are soluble in a solvent and are capable of expressing a colored state and a decolored state through an electrochemical reaction. A known oxidation/reduction coloring organic EC material may be used. Also, a plurality of materials may be used in combination. That is, the organic EC device according to the present embodiment may include a plurality of types of organic EC material. If the organic EC device is used in a light-adjustment element, transmittance contrast and wavelength flatness are required. Considering these, it is preferable to use a material that has high transmittance in a decolored state and has high coloring efficiency (the ratio of the optical density to the amount of injected charge) as the organic EC material. Furthermore, from the view point of wavelength flatness, if it is difficult to realize flat absorbance using one material, a plurality of materials may be used in combination.

As combinations of the organic EC materials, anodic materials that exhibit coloring through an oxidation reaction may be used as a single material or a composite material, or cathodic materials that exhibit coloring through a reduction reaction may be used as a single material or a composite material. Also, the anodic materials and the cathodic materials may be used in combination as single materials, as a single material and a composite material, or as a composite material and a composite material, and they are used in any combination. The organic EC material may include an anodic material or a cathodic material that does not exhibit EC characteristics.

Organic dyes such as viologen-based compounds, styryl-based compounds, fluoran-based compounds, cyanine-based compounds, anthraquinone-based compounds, and aromatic amine-based compounds, and organometallic complexes such as metal-bipyridyl complexes and metal-phthalocyanine complexes may be used as specific examples of the organic EC material, for example. Note that the viologen-based compound may be used as a cathodic organic EC material that is transparent in a stable dication state with a counterion, and is colored in a cation state through a one-electron reduction reaction. Also, a material obtained by dispersing an inorganic EC material in a solution may be used. Examples of the inorganic EC material include tungsten oxide, vanadium oxide, molybdenum oxide, iridium oxide, nickel oxide, manganese oxide, and titanium oxide.

Examples of the anodic organic EC material include thiophene derivatives, metallocene derivatives such as ferrocene, aromatic amine derivatives such as phenazine derivatives, triphenylamine derivatives, phenothiazine derivatives, and phenoxazine derivatives, pyrrole derivatives, and pyrazoline derivatives. However, the anodic organic EC material used in the present invention is not limited thereto.

Examples of the cathodic organic EC material include viologen-based compounds, anthraquinone-based compounds, ferrocenium salt-based compounds, and styrylated compounds. However, the cathodic organic EC material used in the present invention is not limited thereto.

In particular, in order to maintain an absorption spectrum against a change in the temperature, it is preferable that these materials are unlikely to form aggregates. If materials form aggregates, the absorption of the monomer and the absorption of the aggregates are superimposed in the absorption spectrum. The likelihood of the formation of aggregates varies with temperature, and thus, in such a material, the ratio between the absorption of the monomer and the absorption of aggregates varies according to a change in temperature. In order to avoid the formation of aggregates, a method for suppressing the formation of aggregates through steric hindrance by providing a bulky substituent is suitably used.

The organic EC layer 37 is preferably liquid or gel. The organic EC layer 37 is suitably used in the state of a solution, but can be used in a gel state within a range of not significantly impairing the response speed. For gelation, a polymer or a gelling agent is further added to the solution. There is no particular limitation on the polymer (gelling agent), and examples thereof include polyacrylonitrile, carboxylmethylcellulose, polyvinyl chloride, polyvinyl bromide, polyethylene oxide, polypropylene oxide, polyurethane, polyacrylate, polymethacrylate, polyamide, polyacrylamide, polyester, polyvinylidene fluoride, and nafion. In this manner, a viscous compound, gel compound, or the like may be used as the organic EC layer 37.

Also, in addition to use in a mixed state as described above, these solutions may be supported by a mesh structure (for example, sponge) that has a transparent and soft network structure.

The low-resistance wires 38a and 38b are provided for the purpose of reducing the in-plane distribution of the voltage supplied from the power supply terminals 39a and 39b to the transparent electrodes 33 and 35. If a potential gradient is formed in the plane of the transparent electrodes 33 and 35 with respect to distances from the power supply terminals 39a and 39b, unevenness in the electrochemical reaction amount occurs in the plane of the organic EC device. The electrochemical reaction of the organic EC material is more likely to occur on the power supply terminal side with a high potential, and thus, if the organic EC device is driven in a state with a large potential distribution, the reaction of the anodic organic EC material is unevenly distributed on the anode power supply terminal (positive electrode) side, and the reaction of the cathodic organic EC material is unevenly distributed on the cathode power supply terminal (negative electrode) side. As a result, segregation caused by the influence of the potential distribution occurs. In order to keep the potential distribution in the effective light beam region 31 as small as possible, it is preferable to install the power supply terminals 39a and 39b on the long sides of the transparent electrodes 33 and 35, at positions facing each other across the effective light beam region, as the A1 terminal and the C1 terminal shown in FIGS. 2A to 2D.

Furthermore, at this time, in order to suppress a decrease in the potential in the long-side direction to about 10 mV and suppress segregation caused by the potential distribution in the long-side direction, it is necessary to install the low-resistance wires 38a and 38b along the long sides. The plane-resistances of the low-resistance wires 38a and 38b are preferably less than 1/100 of the resistances of the transparent electrodes 33 and 35, and more preferably less than 1/500 of the resistances of the transparent electrodes 33 and 35. A thin film silver wire formed through vacuum film formation or a thick film silver wire formed through screen printing, inkjet coating, or the like may be suitably used as the low-resistance wires 38a and 38b.

Control Transmittance of Light Transmittance Changeable Element

The transmittance of the light transmittance changeable element 101 is controlled by the transmittance controller 102. As a method for controlling the transmittance of the light transmittance changeable element 101 by the transmittance controller 102, a method suitable for an element to be used is adopted. Specifically, a method in which predefined conditions are input to the light transmittance changeable element 101 with respect to the setting value of a desired transmittance, or a method in which the transmittance of the light transmittance changeable element 101 is compared to the setting value of the transmittance, and the conditions are selected and input so as to meet the setting value. The voltage, electric current, and duty ratio are examples of the conditions to be input. By changing the transmittance of the light transmittance changeable element 101, it is possible to control the amount of the light incident on the image sensor 103 independently of the other exposure parameters such as the aperture, shutter speed, and gain. Increasing or reducing the transmittance of the light transmittance changeable element 101 makes it possible to increase or reduce the amount of the subject light 105 incident on the image sensor 103, and select and use a desired value for the imaging conditions. For example, when the quantity of incident light desired by a photographer is R times the amount of the incident light before the transmittance of the light transmittance changeable element 101 changes, a desired light amount can be realized by setting the transmittance of the light transmittance changeable element 101 to R-fold.

Because this light transmittance changeable element 101 is basically a light attenuation element, the range of transmittance (T) is greater than 0 and less than 1 (0<T<1).

Herein, a specific method for controlling the transmittance in the case where the organic EC device described with reference to FIGS. 2A to 2D is used as the light transmittance changeable element 101 will be described. Herein, it is presumed that a material for forming cations from a neutral species through an oxidation reaction to undergo coloring is used as the organic EC material. The transmittance of the organic EC device follows the Lambert-Beer's law shown in Equation (1) below.

$$-\log(T/100)=OD=\varepsilon \cdot c \cdot L \tag{1}$$

In Equation (1), T represents the transmittance (%), OD represents the optical density, ε represents the molar absorption coefficient of the cation, c represents the concentration of the generated cations, and L represents the length of the light path. As is understood from Equation (1), the transmittance of the organic EC device is adjusted by the cation concentration. Also, the cation concentration is adjusted through an electrochemical reaction.

In the electrochemical reaction, if the material moves back and forth between the neutral state and the cation state, by providing a potential that is more positive (larger) than the potential (oxidation potential) of the material that is required for oxidation, the material is oxidized from the neutral state to become cations. In contrast, by providing a potential that is more negative (smaller) than the reduction potential, the material returns to the neutral state from the cation state.

The oxidation potential and the reduction potential show a deviation of approximately 60 mV in the ideal situation of a one-electron reaction at room temperature. In particular, ½ of the sum of the oxidation potential and the reduction potential is referred to as an oxidation-reduction potential. In the electrochemical reaction, the larger a potential with respect to the oxidation potential of the material is provided, the more likely an oxidation reaction is to progress. A kinetic equilibrium state varies depending on the potential, and thus it is possible to empirically adjust the concentration of cations according to the magnitude of the oxidation potential as appropriate. That is, adjusting the magnitude of the voltage to be applied makes it possible to adjust the concentration of cations and adjust the amount of change in transmittance.

As described above, the organic EC device is capable of changing the transmittance of the organic EC layer 37 and adjusting the quantity of passing light by controlling the voltage applied from the transmitted light amount operation unit 12.

Method for Acquiring Temperature Information

The temperature information acquisition unit 109 acquires information regarding the temperature of the light transmittance changeable element 101. Either a direct acquiring method or an indirect measuring method may be used to acquire the temperature information. An example of the former is a method for directly measuring the temperature using a thermometer, and an example of the latter is a method for estimating the temperature utilizing the amount of the incident light and an ambient temperature detection unit. A thermistor, a thermocouple, a radiation thermometer, or the like may be used as the thermometer of the former. Herein, examples of the latter will be described in detail bellows.

The light incident on the image capturing device passes through the front light transmission reducing element 108, the light transmittance changeable element 101, and the post light transmission reducing element 116 such as the IR filter 116, and is incident on the image sensor 103. The temperature information acquisition unit 109 plays the role of detecting the ambient temperature of the light transmittance changeable element 101. In order to accurately measure the ambient temperature of the light transmittance changeable element 101, the temperature information acquisition unit 109 may be arranged in the vicinity of the light transmittance changeable element 101.

A change in the temperature ($T_F$) of the light transmittance changeable element 101 may be written as Equation (2) below.

$$\frac{dt_F}{dt} = \frac{1}{C}\frac{dQ_F}{dt} \quad (2)$$

where C represents the heat capacity of the light transmittance changeable element 101, and $Q_F$ represents the balance of the heat quantity of the light transmittance changeable element 101. Considering the balance of the heat quantity into the input and the output of heat quantity, the balance of the heat quantity is expressed as Equation (3) below $$\frac{dQ_F}{dt} = \frac{dQ_{F\_IN}}{dt} - \frac{dQ_{F\_OUT}}{dt} \quad (3)$$

where $Q_{F\_IN}$ represents the input of the heat quantity, and $Q_{F\_OUT}$ represents the output of heat quantity.

The light transmittance changeable element 101 has low thermal conductivity, and it is presumed that the Newton's law of cooling applies to the output of heat quantity from this element. The output of heat quantity from the element is proportional to a temperature difference between the temperature of the light transmittance changeable element 101 and the ambient temperature, and thus may be written as Equation (4) below $$\frac{dQ_{F\_OUT}}{dt} = \alpha S(T_F - T_m) \quad (4)$$

where $\alpha$ represents a heat exchange coefficient, S represents the surface area of a target site of the light transmittance changeable element 101, and $T_m$ represents the ambient temperature.

On the other hand, an input ($q_F$) of the heat quantity resulting from the light incident on the element used as the light transmittance changeable element 101 per unit time is written as Equation (5) below.

$$\frac{dQ_{F\_IN}}{dt} = q_F = q_0(\lambda)Tr_U(\lambda)(1 - Tr_F(\lambda)) \quad (5)$$

where $q_0(\lambda)$ represents the incident heat quantity per unit time, $Tr_U(\lambda)$ represents the transmittance of the front light transmission reducing element 108, and $Tr_F(\lambda)$ represents the transmittance of the light transmittance changeable element 101.

When a differential equation in Equation (2) is solved where $q_F$ is constant, the temperature of the light transmittance changeable element 101 may be written as Equation (6) below.

$$T_F = \left(T_0 - T_m - \frac{q_F}{\alpha S}\right)e^{\frac{\alpha S}{C}t} + T_m + \frac{q_F}{\alpha S} \quad (6)$$

where $T_0$ represents the initial temperature of the light transmittance changeable element 101.

It can be seen that, if the incident heat quantity ($q_0(\lambda)$) per unit time at each point in the plane (in the light path) in a direction that is orthogonal to the direction of the light beam incident on the light transmittance changeable element 101 can be obtained, the temperature at each point in the plane of the light transmittance changeable element 101 can be estimated without arranging a temperature sensor at the points in the plane of the light transmittance changeable element 101.

The subject light incident on the image capturing apparatus 100 passes through the front light transmission reducing element 108, the light transmittance changeable element 101, and the post light transmission reducing element 116, and is incident on the image sensor 103. Based on this, if the information regarding the transmission spectra of the front light transmission reducing element 108, the light transmittance changeable element 101, and the post light transmission reducing element 116 is obtained, the amount of the incident light in a wavelength region that can be supported by this image capturing apparatus 100 can be obtained. Specifically, when the quantity of light that reaches the image sensor 103 is $I_D(\lambda)$, the amount being calculated from the signal from the image sensor 103, the amount of the light incident on the image capturing device $I_0(\lambda)$ may be written as Equation (7) below.

$$I_0(\lambda) = \frac{I_D(\lambda)}{Tr_U(\lambda)Tr_L(\lambda)Tr_F(\lambda)} \quad (7)$$

where $Tr_L(\lambda)$ represents the transmittance of the post light transmission reducing element 116.

Also, by defining the spectral shape of the incident light (wavelength distribution of incident light energy), it is possible to estimate the temperature including the heat quantity corresponding with the light in a wavelength region in which the light does not pass through the post light transmission reducing element 116 and in a wavelength region in which the image sensor 103 has no sensitivity. With regard to this spectral shape of the incident light, it is preferable to use the assumed incident light, and most preferable to use the sunlight spectrum in the first embodiment. This is because, in general, when an image is captured, high-intensity light incident on the image sensor 103 is likely to be the sunlight or have a spectrum that is similar to that of sunlight (white light).

With the image capturing apparatus 100, wavelength dependent data regarding the transmittance of the front light transmission reducing element 108, the light transmittance changeable element 101, and the post light transmission reducing element 116 that are included in the image capturing apparatus 100 are acquired in advance. Then, the amount of the incident light can be calculated using a light intensity profile acquired by the image sensor 103 and the spectral shape of the incident light.

A specific example is shown in FIG. 3. The vertical axis indicates the energy density of a wavelength, and the horizontal axis indicates the wavelength. In FIG. 3, a region below a region 130 is the spectrum of incident light, and a region below a region 131 is the intensity of the light that passes through the front light transmission reducing element 108 and is incident on the light transmittance changeable element 101 in the state in which the diaphragm 107 is fully opened. Herein, when the ambient temperature of the light transmittance changeable element 101 is 25° C. and the light attenuation is in the third stage, the light in the visible light region is reduced to approximately 12.5% through absorption of the light transmittance changeable element 101. Herein, light attenuation (nth stage) refers to the light attenuated state (light absorbed state) where the transmittance T is equal to ½n. Specifically, if the light attenuation is in the first stage, the transmittance T is 50%, and if the light attenuation is in the second stage, the transmittance T is 25%. As a result, the intensity of the light incident on the post light transmission reducing element 116 is reduced to a region indicated by a region 132 and a region 133, and finally, the intensity of the light incident on the image sensor 103 becomes a region 133 (0.18 W). At this time, if most of the light incident on the light transmittance changeable element 101 is concentrated at a site with a diameter of 5 mm, the temperature at this site of the light transmittance changeable element 101 reaches 118° C. as shown in FIG. 4. Note that FIG. 4 is a diagram showing the relation between the condensing diameter (the horizontal axis) on the light transmittance changeable element 101 and the temperature (the vertical axis) in a case where the ambient temperature is 25° C. Because the light transmittance changeable element 101 is arranged immediately in front of the image sensor 103, the in-plane positional distribution of the intensity of the light emitted on the light transmittance changeable element 101 is approximately similar to the in-plane positional distribution of the image sensor 103 and can be specified. In this manner, it is possible to acquire the information regarding the temperature in the plane of the light transmittance changeable element 101.

Change in Temperature of Light Transmittance Changeable Element

Herein, the case where the temperature of the light transmittance changeable element 101 is high will be described. It is presumed as one example that reference sunlight (AM 1.5, 1000 W/m2) is incident on the image capturing apparatus 100. FIG. 5 shows the spectrum of the reference sunlight. The vertical axis indicates the heat quantity density per wavelength, and the horizontal axis indicates the wavelength. As shown in FIG. 5, the sunlight has a heat quantity over a wide region from ultraviolet, visible, to infrared light. When a lens diameter is 70 mm and the condensing diameter on the light transmittance changeable element 101 is 5 mm, with a simple estimation, light that is approximately 200 times the intensity of sunlight is incident on the light transmittance changeable element 101, and the temperature of the element is increased by the incident light.

The relationship between the incident light and an increase in the temperature of the light transmittance changeable element 101 will be specifically described below using values of the front light transmission reducing element 108, the light transmittance changeable element 101, and the post light transmission reducing element 116 that are used in the first embodiment.

When the lens diameter is 70 mm, the quantity of light incident on the image capturing apparatus 100 is 3.85 W (=1000 Wm−2×(0.007 m/2)2×π). Herein, when the reference sunlight is incident on the image capturing apparatus 100, the amount of the light that passes through the front light transmission reducing element 108 and is incident on the light transmittance changeable element 101 in the state in which the diaphragm 107 is fully opened is 3.34 W due to the spectrum and the transmission spectrum of the sunlight. Also, if the light attenuation of the light transmittance changeable element 101 is in the third stage, the amount of the light absorbed by this element is 2.45 W, and the amount of the light that passes through the post light transmission reducing element 116 such as the IR filter 116 and is incident on the image sensor 103 is 0.18 W. In Equation (6), if a sufficient time period has elapsed, the first term on the right side approaches zero, and thus the temperature of the light transmittance changeable element 101 may be written using the ambient temperature and the amount of the incident light (heat quantity). From the relationship between the condensing diameter and the temperature shown in FIG. 4, it can be seen that, if the condensing diameter on the light transmittance changeable element 101 is small, the temperature of the light transmittance changeable element 101 is high.

Elements such as a liquid crystal element and an organic electrochromic device that are preferably used as the light transmittance changeable element 101 are elements involving movements of organic molecules, and thus are problematic in a change in the temperature, in particular, in maintaining the characteristics at high temperature. There are two causes for an increase in the temperature of this light transmittance changeable element 101 as follows. (A) Ambient temperature of the light transmittance changeable element 101 is high, and (B) heat quantity generated by light absorption by the light transmittance changeable element 101 is large These two causes together and not individually increase the temperature of the light transmittance changeable element 101.

In these causes, a reduction in the temperature in (A) can be dealt with by utilizing a known technique such as utilizing a heat dissipation member. In contrast, the technique in this first embodiment effectively functions against a reduction in the temperature in (B). Specifically, if heat quantity generated by light absorption by the light transmittance changeable element 101 is large, the heat quantity resulting from the light absorption is suppressed by increasing the transmittance. At this time, by changing the exposure parameters so as to reduce the influence of a change in the transmittance of the light transmittance changeable element 101 synchronously with an increase in the transmittance, the influence on the acquired image is suppressed. This makes it possible to acquire an image with an appropriate exposure while suppressing the influence of an increase in the light transmittance changeable element 101 on the image.

As described above, an increase in the temperature of the light transmittance changeable element 101 appears as the sum of the above-described two causes (A) and (B). Thus, there are cases where simply observing only the amount of the light absorbed by the light transmittance changeable element 101 related to (B) is not sufficient to suppress the influence of an increase in the temperature on the characteristics of the light transmittance changeable element 101. In this case, it is desirable to acquire information regarding the ambient temperature of the light transmittance changeable element 101 related to (A) in addition to this, or information regarding the temperature of the light transmittance changeable element 101 appearing as the sum of them. This is because, if only the amount of the incident light is used, there is a possibility that the influence of the amount of the incident light on the temperature of the light transmittance changeable element 101 will be overestimated or underestimated. Specific examples will be described below.

With regard to a change in the characteristics caused by the temperature of the light transmittance changeable element 101, when the temperature serving as the upper limit at which the characteristics do not change is constant, if the ambient temperature is high, a tolerance width of an increase in the temperature caused by the incident light decreases. Also, conversely, if the ambient temperature is low, the tolerance width increases. If attempts are made to suppress an increase in the temperature by changing the transmittance of the light transmittance changeable element 101 using only the information regarding the amount of the incident light, this increase or decrease in the tolerance width caused by the ambient temperature cannot be reflected. As a result, there is a possibility that the influence of the amount of the incident light on the temperature of the light transmittance changeable element 101 will be overestimated or underestimated. In order to prevent this, the image capturing device of the present embodiment has the temperature information acquisition unit 109 configured to acquire information regarding the temperature of the light transmittance changeable element 101. It is possible to accurately estimate the influence of the amount of the incident light on the temperature of the light transmittance changeable element 101 using this temperature information acquisition unit 109, and to perform more suitable handling (control the transmittance).

Specifically, if the temperature of at least a portion of the light transmittance changeable element 101 exceeds a predetermined temperature, the amount of the light absorbed (heat quantity) is reduced by increasing the transmittance of the light transmittance changeable element 101, that is, making it brighter. This predetermined temperature is preferably set to be lower than the temperature at which the characteristics of the light transmittance changeable element 101 vary. A specific temperature range varies depending on the light transmittance changeable element 101 to be used, but examples thereof include a range of 40° C. to 120° C., and in particular, a range of 60° C. to 100° C.

Control Temperature and Transmittance of Light Transmittance Changeable Element

Figure 6A:
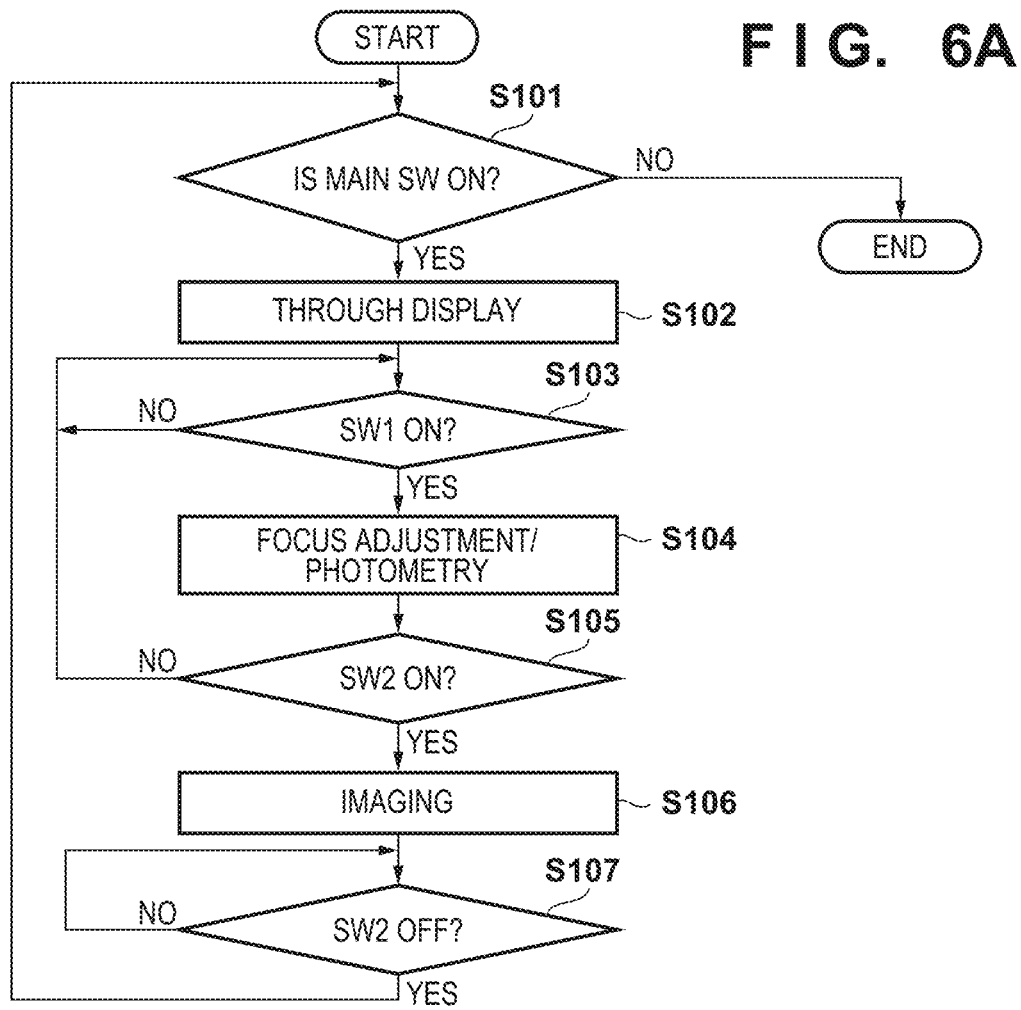
FIGS. 6A and 6B are flowcharts showing a main routine at the time of imaging a still image and showing processing when temperature increases according to a first embodiment.
Figure 6B:
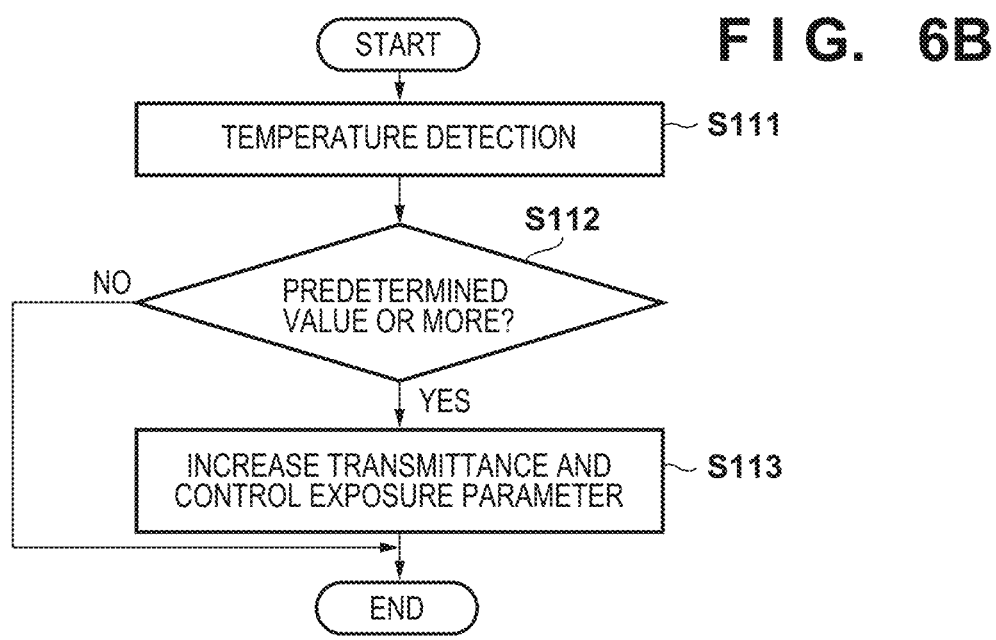

Hereinafter, how to deal with a situation in the first embodiment when the temperature of the light transmittance changeable element 101 increases will be described with reference to the flowcharts shown in FIGS. 6A and 6B. FIG. 6A is a flowchart showing a main routine when the image capturing apparatus 100 captures a still image, and FIG. 6B shows processing at the time of an increase in the temperature.

In FIG. 6A, the controller 114 determines in step S101 whether or not the main SW 120 is ON. If the main SW 120 is not ON, processing ends, and if the main SW 120 is ON, processing proceeds to step S102. In step S102, the controller 114 turns ON the image display of the image display unit 128, sets the image display unit 128 to a through display for successively displaying data of the captured image on the image display unit 128, and processing proceeds to step S103. Note that in the through display state, the subject image that has passed through the light transmittance changeable element 101 is photoelectrically converted by the image sensor 103, and the image data processed by the signal processing unit 112 is successively displayed by the image display unit 128. An image monitor function is realized in this manner.

The controller 114 determines in step S103 whether the release SW1 (121) is turned ON. If the release SW1 (121) is ON, processing proceeds to step S104, and if the release SW1 (121) is not ON, the controller 114 repeats the determination of step S103. In step S104, the controller 114 performs focus adjustment processing to adjust the focus of the lens 106 on the subject, and performs photometry processing using the exposure meter 115 or the like to determine the aperture and the shutter speed. When focus adjustment and photometry processing ends in step S104, the processing proceeds to step S105, and the controller 114 determines whether the release SW2 (122) is turned ON. If the release SW2 (122) is not turned ON, the processing returns to step S103.

If the release SW2 (122) is turned ON, the processing proceeds to step S105, and imaging processing is executed. In the imaging processing, the image data obtained by the signal processing unit 112 processing the image signal obtained by the image sensor 103 is recorded in the recording medium via the recording unit 113.

If the imaging processing ends, the processing proceeds to step S107, and the controller 114 determines the state of the release SW2. If the release SW2 is in the ON state (NO in step S107), the controller 114 waits for the release SW2 to be turned OFF, and if the release SW2 is in the OFF state (YES in step S107), the processing returns to step S101, and the above-described processing is repeated.

FIG. 6B shows the responses taken when temperature increases while through display is performed. This processing is performed in parallel to the main routine shown in FIG. 6A, and is subjected to repetitive interruption processing in the processing starting from step S102 to step S107.

First, in step S111, as described above, the temperature information acquisition unit 109 detects the temperature of the light transmittance changeable element 101. Next, the controller 114 determines in step S112 whether or not the temperature of at least a portion of the light transmittance changeable element 101 is a predetermined temperature or more. As a result of the determination, if the temperature of the portion is the predetermined temperature or more, the processing proceeds to step S113, and if it is less than the predetermined temperature, this processing ends.

As one example, it is assumed that, in a temperature range exceeding 100° C., it is difficult for the organic EC device used as the light transmittance changeable element 101 to maintain its characteristics that are similar to those at room temperature, and it is necessary to reduce the temperature. In this case, in step S111, when the temperature information acquisition unit 109, using the above-described method, acquires information that the temperature at a specific site of the light transmittance changeable element 101 has reached 118° C., processing for reducing the temperature is performed in step S113.

Specifically, in step S113, the exposure parameters are controlled at the same time as increasing the transmittance of the light transmittance changeable element 101. Note that, although detailed exposure parameters to be controlled and the values thereof will be described later, a gain is reduced as one example. When the processing of step S113 ends, the interruption processing ends. Note that so-called feedback transmittance control is executed under which the transmittance of the light transmittance changeable element 101 is adjusted to the optimum transmittance as appropriate, based on the luminance of the subject that has been obtained through the photometry processing in step S104. In the present embodiment, by performing transmittance control based on the information regarding the temperature of the light transmittance changeable element 101 in addition to this feedback transmittance control, a settable transmittance is provided with a limit. Thus, even if the transmittance of the light transmittance changeable element 101 is controlled in correspondence with the same subject luminance, the transmittance to be set in the case where the temperature of the light transmittance changeable element 101 that was detected by the temperature information acquisition unit 109 is less than the predetermined temperature is different from that in the case where the temperature of the light transmittance changeable element 101 that was detected by the temperature information acquisition unit 109 is the predetermined temperature or more.

Note that, although the processing in the case where the still image is captured (acquired) was described in the above-described example, the processing shown in FIG. 6B can also be performed while a moving image for recording is being captured (acquired).

Figure 7:
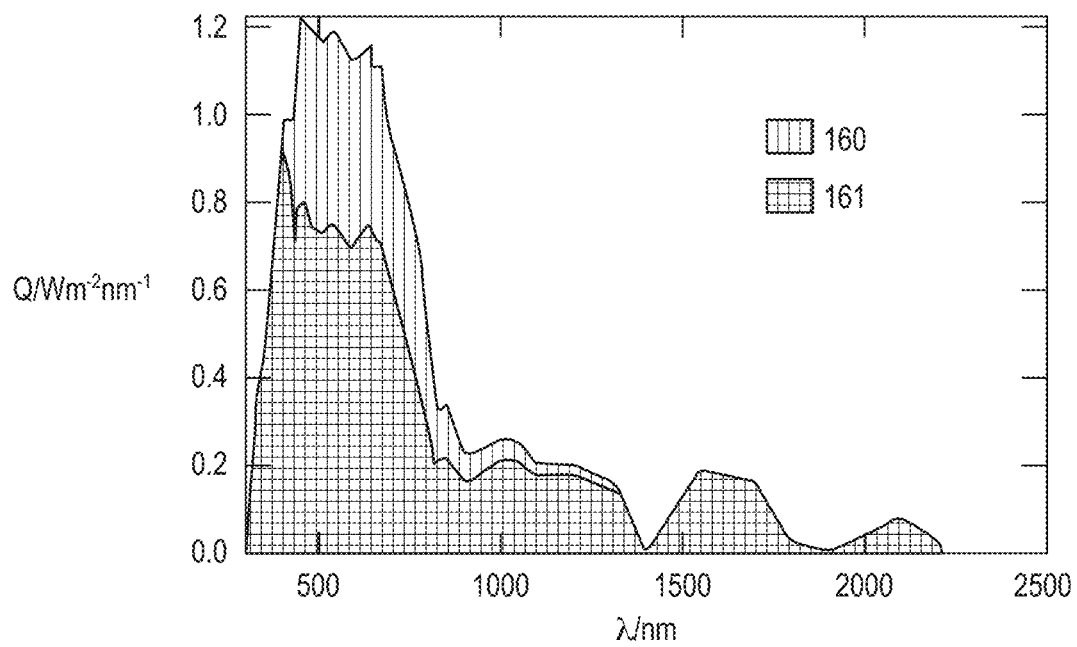
FIG. 7 is a diagram showing a spectrum of light absorbed by the light transmittance changeable element.

FIG. 7 shows the spectrum of light absorbed by the light transmittance changeable element 101, out of the incident light. The vertical axis indicates the energy density of a wavelength, and the horizontal axis indicates the wavelength. If the light attenuation of the light transmittance changeable element 101 is in the third stage (transmittance is 12.5%), the light transmittance changeable element 101 absorbs energy corresponding to regions indicated by a region 160 and a region 161. In contrast, if the light attenuation of the light transmittance changeable element 101 is changed to the first stage (transmittance is 50%), the light transmittance changeable element 101 absorbs energy corresponding to the region 161. As a result, the overall absorbed energy can be reduced to 73% of the case where the light attenuation is in the third stage. As a result, the temperature of the light transmittance changeable element 101 is reduced from 118° C. to 93° C. in the case where the light attenuation is in the third stage. Because of this, the organic electrochromic device used as the light transmittance changeable element 101 is capable of maintaining characteristics that are similar to those at room temperature.

Incidentally, in addition to the case where the light transmittance changeable element 101 has a high temperature, an example of the useful effects of this first embodiment is a reduction in the energy consumption. Elements such as a liquid crystal element and an organic electrochromic device that are preferably used as the light transmittance changeable element 101 are elements whose transmittance changes due to a voltage being applied to the elements, and thus a certain amount of power is required in order to drive these elements.

From the viewpoint of energy saving and heat countermeasures of an image capturing device, this energy consumption is preferably reduced. This is particularly important in an image capturing device in which a power source with limited capacity, such as a battery, is used. There are two types of light transmittance changeable element 101, one being colored and the other being decolored conversely when a voltage is applied. In both cases, if imaging is performed under a certain condition for a long time, keeping the voltage in a colored state that is close to the state where no voltage is applied results in a reduction in the energy consumption. Specifically, the transmittance of the light transmittance changeable element 101 is changed to the state where power is reduced within a range in which the transmittance can be compensated for by other exposure parameters, and in synchronization, the exposure parameters are changed so as to reduce the influence of a change in the transmittance of the light transmittance changeable element 101. As a result, it is possible to reduce energy consumption while suppressing an influence on the acquired image. In particular, the organic electrochromic device is a device that is colored as a result of an electric current flowing due to a voltage being applied, and thus the effect thereof is large, compared to a liquid crystal element that operates with a voltage being applied.

In the image capturing apparatus 100 of the first embodiment, when the transmittance of the light transmittance changeable element 101 is changed, the exposure parameters are synchronously adjusted, and the influence of a change in the light amount resulting from a change in the transmittance on an image acquired by the image sensor 103 is reduced. Examples of the exposure parameters include the shutter speed, the aperture, and ISO sensitivity (gain), and these are controlled by the exposure parameter controller 104. Out of these exposure parameters, gain is used preferentially. This is because, if the influence caused by a change in the transmittance of the light transmittance changeable element 101 can be suppressed using the gain, it is not necessary to change the shutter speed or the aperture, and thus it is possible to acquire an image without affecting the depth of field or continuity of the motion of the subject in the captured image. Also, the case where the transmittance of the light transmittance changeable element 101 is reduced may have the influence of an increase in noise resulting from an increase in the gain, but the case where the transmittance of the light transmittance changeable element 101 is increased has no increase in noise, and thus the gain of the exposure parameters is most preferably preferentially used.

Of course, the shutter speed and the aperture that are exposure parameters other than the gain may also be used in order to reduce the influence resulting from a change in the transmittance of the light transmittance changeable element 101. If the shutter speed is changed, although there is a possibility of a change in the motion of a subject in a still image or a change in the continuity of a moving image in the case of a moving image, the shutter speed may be changed within a range in which the influence thereof does not cause much decrease in image quality. Inversely, the influence thereof may be positively utilized as an expression. Also, if the aperture is changed, the depth of field changes, but the aperture may be changed within a range in which the influence thereof does not cause much decrease in image quality. Inversely, the influence thereof may be positively utilized as an expression. Also, these parameters may be used in combination and adjusted.

The relationship between a change in the transmittance of the light transmittance changeable element 101 and exposure adjustment for reducing the influence of the change will be described below using an APEX system.

In order to obtain an appropriate exposure, the conditions indicated in Equation (8) below are satisfied.

$$Sv+Bv=Av+Tv \qquad (8)$$

where Sv represents a sensitivity value, Bv represents a luminance value, Av represents an aperture, and Tv represents a time value.

The APEX units of the parameters are given after being convened from physical quantities using Equations (9) below.

$$Sv=\log 2(ISO \cdot N)$$

$$Bv=\log 2(B \cdot NK)$$

$$Av=\log 2(F2)$$

$$Tv=\log 2(1/T) \qquad (9)$$

where ISO represents the ISO sensitivity, B represents luminance, N and K represent constants, F represents a lens aperture (F-number), and T represents a shutter speed (seconds).

Herein, the case where the transmittance of the light transmittance changeable element 101 is changed to R-fold, and the influence of the change is suppressed using the ISO sensitivity is considered. When the transmittance changes to R-fold, the luminance B changes to R-fold, and thus if the right side in Equation (8) is constant, it is possible to suppress the influence resulting from a change in the transmittance of the light transmittance changeable element 101 by setting the ISO sensitivity to 1/R times the ISO sensitivity prior to the change.

Similarly, if the influence is suppressed using the lens aperture (F-number), it is possible to suppress the influence of a change in the transmittance of the light transmittance changeable element 101 by setting the F-number to R1/2 times the F-number prior to the change.

Also, if the influence is suppressed using the shutter speed, it is possible to suppress the influence of a change in the transmittance of the light transmittance changeable element 101 by setting the shutter speed to 1/R times the shutter speed prior to the change. Table 1 shows the relationship between the magnifications of a change in each exposure parameter for suppressing the influence of a change when the transmittance of the light transmittance changeable element 101 is changed to R-fold.

| | Magnification | | |
|---|---|---|---|
| R | ISO sensitivity | F-number | Shutter speed |
| 0.031 | 32 | 0.18 | 32 |
| 0.063 | 16 | 0.25 | 16 |
| 0.125 | 8 | 0.35 | 8 |
| 0.25 | 4 | 0.50 | 4 |
| 0.5 | 2 | 0.71 | 2 |
| 1 (no change) | 1 | 1 | 1 |
| 2 | 0.5 | 1.4 | 0.5 |
| 4 | 0.25 | 2.0 | 0.25 |
| 8 | 0.125 | 2.8 | 0.125 |
| 16 | 0.0625 | 4.0 | 0.063 |
| 32 | 0.03125 | 5.7 | 0.031 |

Although either an automatic method or a manual method may be used, synchronous control using exposure parameters is preferably performed automatically when the transmittance of the light transmittance changeable element 101 is changed. In any case, the exposure parameters are changed in synchronization with a signal for changing the transmittance of the light transmittance changeable element 101. Also, any constituent element in the image capturing device may carry out the function of performing this synchronous control using the exposure parameters, or the exposure parameter controller 104 or the controller 114 may carry out this function.

Note that a method in which as a result of a change in the transmittance of the light transmittance changeable element 101, a change in the quantity of light that reaches the image sensor 103 is detected and the exposure parameters are changed is thought of as the asynchronous control method, for example. However, with this method, for example, when a moving image is captured, the exposure parameters are changed after a change in the transmittance of the light transmittance changeable element 101 has affected the image to be acquired. Thus, compared to the case where the exposure parameters are changed synchronously, a change in the transmittance of the light transmittance changeable element 101 has a greater influence on the acquired image. Also, devices are required in order to distinguish whether a change in the amount of the light that reaches the image sensor 103 is caused by a change in the transmittance of the light transmittance changeable element 101 or is caused by a change in the amount of the light incident on the image capturing device from the outside. This is because, if a change in the amount of the light that reaches the image sensor 103 is caused by a change in the transmittance of the light transmittance changeable element 101, it is necessary to change the exposure parameters, but if it is caused by a change in the amount of the light incident on the image capturing device from the outside, it is sometimes better to not change the exposure parameters. In this respect, it is preferable to change the exposure parameters in synchronization with a signal for changing the transmittance of the light transmittance changeable element 101.

Also, this synchronous exposure parameter control may be performed through automatic control where the controller 114 and the exposure parameter controller 104 operate together, for example. On the other hand, when a user operates an exposure parameter in a manual mode, it is preferable that this automatic control function is stopped by the controller 114, for example. Accordingly, it is possible to prevent the exposure parameter from changing in synchronization with a change in the transmittance of the light transmittance changeable element 101 when the user manually controls the exposure parameter.

Also, if the transmittance of the light transmittance changeable element 101 is simply increased while capturing a moving image or continuously capturing still images, the amount of the light incident on the image sensor 103 increases, and the influence of this increase is reflected in the captured image. Because such an unintended change in the image is not preferable, it is desirable to suppress such a change.

The following describes an example in which the exposure parameters are changed in synchronization with the case where the light attenuation of the light transmittance changeable element 101 is changed from the third stage (transmittance is 12.5%) to the first stage (transmittance is 50%) while capturing a moving image, so as to reduce the influence of a change in the transmittance of the light transmittance changeable element 101.

A signal for changing the light attenuation of the light transmittance changeable element 101 from the third stage to the first stage is generated by the transmittance controller 102, and a signal for controlling the exposure parameters is transmitted from the exposure parameter controller 104 in synchronization therewith. Herein, Table 2 shows the results of evaluation of the quality of images obtained in the case where three types of exposure parameters of the shutter speed, the aperture, and the gain are synchronously changed by 2 stages with reference to Table 1 such that the influence of a change in the light attenuation of the light transmittance changeable element 101 is cancelled.

| C | Recognition of change in light amount | Recognition of influence on video |
|---|---|---|
| Shutter Speed | no recognition | almost no recognition, slight incontinuous feel |
| Aperture | no recognition | slight deepening of depth of field |
| Gain | no recognition | no recognition |

With regard to a change in the light amount, no change in the light amount in the acquired video was recognized even when any parameters were selected. In contrast, with the method for detecting a change in the amount of the light that reaches the image sensor 103 and changing the exposure parameters, a change in the transmittance of the light transmittance changeable element 101 affects the image to be acquired and is then responded, and thus a change in the light amount is recognized. In this manner, when the transmittance of the light transmittance changeable element 101 is changed, the exposure parameters are changed synchronously so as to reduce the influence of a change in the transmittance of the light transmittance changeable element 101, and thus it is possible to effectively suppress the influence of this change in the transmittance of the light transmittance changeable element 101.

Also, when the shutter speed is selected as a parameter to be changed, as the transmittance of the light transmittance changeable element 101 increases, the shutter speed is increased. As a result, although the image is hardly affected, a slightly incontinuous feel (low continuity of the motion of the subject) is recognized. Also, when the aperture is selected as a parameter to be changed, as the transmittance of the light transmittance changeable element 101 increases, the aperture is increased (narrowed down). As a result, the influence on the image is small, but slight deepening of the depth of field is recognized. Also, when the gain is selected as a parameter to be changed, as the transmittance of the light transmittance changeable element 101 increases, the gain is reduced. As a result, no influence on the image is recognized. Based on these results, it can be seen that synchronously changing the exposure parameters so as to reduce the influence of a change in the transmittance of the light transmittance changeable element 101 is effective, and out of the exposure parameters, selecting the gain as the parameter to be changed is most effective.

As described above, according to the first embodiment, while preventing an increase in the temperature of the light transmittance changeable element 101 by increasing the transmittance, it is possible to reduce the influence of a change in the transmittance on the image by adjusting the exposure according to a change in the transmittance.

Note that if the temperature of a portion of the light transmittance changeable element 101 increases in the first embodiment, the optical characteristics of this portion change (with respect to the theoretical values). For example, if the temperature of a central portion of the light transmittance changeable element 101 at which the incident luminous flux is concentrated is higher than the temperature of the surrounding region of the light transmittance changeable element 101, the optical characteristics of the central portion of the light transmittance changeable element 101 are different from those of the surrounding portions of the light transmittance changeable element 101. Thus, for example, a configuration may be adopted in which information regarding a temperature distribution in the plane of the element is acquired as the temperature information of the light transmittance changeable element 101 that is acquired by the temperature information acquisition unit 109, and exposure correction for the gain or the like is performed on the output image in accordance with this temperature distribution.

Second Embodiment

Figure 8:
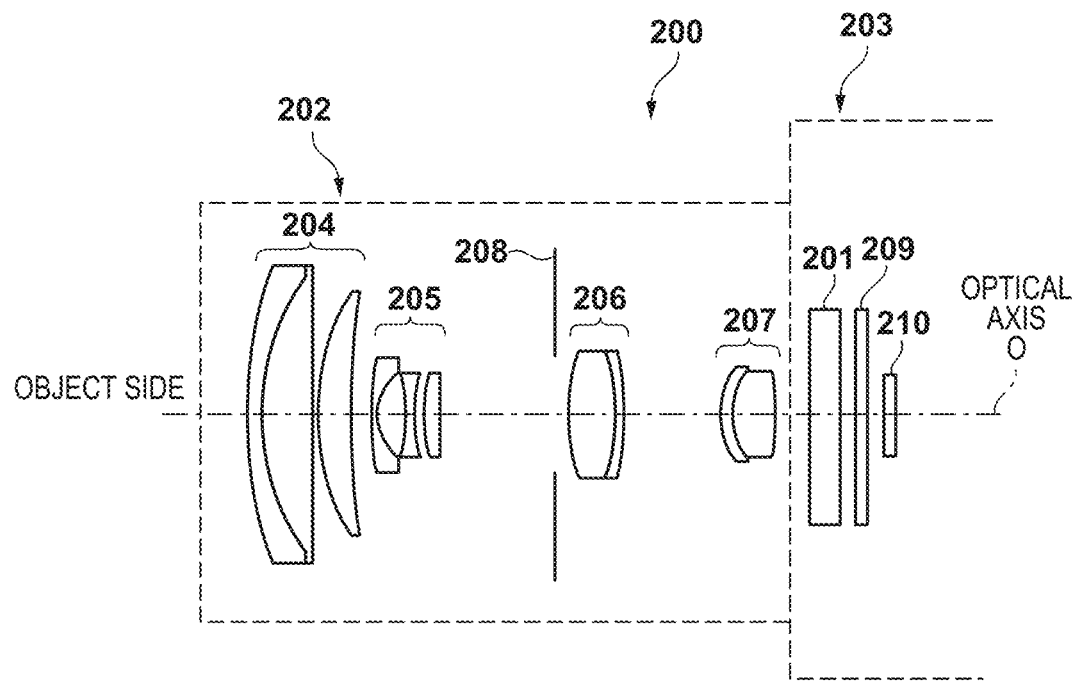
FIG. 8 is a cross-sectional view, passing through an optical axis, that shows portions of an image capturing apparatus according to a second embodiment.

Next, a second embodiment of the present invention will be described. FIG. 8 is a cross-sectional view, passing through an optical axis O, that shows a lens unit 202 and portions of a camera unit 203 of an image capturing apparatus 200 in the second embodiment.

The lens unit 202 is a unit that has a plurality of lenses or lens groups, and is detachably connected to the camera unit 203 via a mount member (not shown). In FIG. 8, the lens unit 202 is a rear focus type zoom lens in which focusing is performed by moving a lens or lenses behind an aperture diaphragm 208. The lens unit 202 has four lens groups, namely, in order from the object side, a first lens group 204 with a positive refractive power, a second lens group 205 with a negative refractive power, a third lens group 206 with a positive refractive power, and a fourth lens group 207 with a positive refractive power. Zooming in/out is performed by changing the space between the second lens group 205 and the third lens group 206, and focusing is performed by moving the fourth lens group 207.

The aperture diaphragm 208 is arranged in the lens unit 202 between the second lens group 205 and the third lens group 206. The aperture diaphragm 208 is arranged such that light passing through the lens unit 202 passes through the lens groups and the aperture diaphragm 208, and the light amount can be adjusted using the aperture diaphragm 208.

Note that the configuration of the lens unit 202 can be selected as appropriate, and may be of an inner focus type which performs focusing by moving a lens or lenses before the aperture, or any other type, in addition to the rear focus type. Also, special lenses such as a fish-eye lens and a macro lens can be selected as appropriate, in addition to the zoom lens.

The camera unit 203 includes a light transmittance changeable element 201, an IR cut filter 209, and an image sensor 210, in order from the lens unit 202 side.

The light transmittance changeable element 201 is an optical filter that is constituted by a liquid crystal element, an organic electrochromic (EC) device, or the like, and is capable of adjusting the amount of passing light. In the second embodiment, the light transmittance changeable element 201 and the IR cut filter 209 are provided in the camera unit 203, and thus even if the camera unit 203 is exchanged for another lens unit, the light amount can be similarly adjusted. Note that the arrangement of the light transmittance changeable element 201 can be changed as appropriate, and the light transmittance changeable element 201 may be arranged inside the lens unit 202, for example. At this time, if the light transmittance changeable element 201 is arranged at the position at which light converges, the area of the light transmittance changeable element 201 can be made small.

The IR cut filter 209 is an optical filter that cuts light that has passed through the light transmittance changeable element 201 by absorbing or reflecting infrared rays and allows visible light to pass through. It is possible to reduce the influence of infrared light on the image generated by the image sensor 210, which will be described later.

The image sensor 210 is constituted by a CCD, a CMOS, and the like, and is capable of generating an image from the incident light. The image sensor 210 is arranged so as to receive light that has passed through the IR cut filter 209. Thus, the light transmittance changeable element 201 adjusts the amount of the light that has been incident from the object side, the IR cut filter 209 cuts the infrared light of the light whose amount is adjusted by the light transmittance changeable element 201, and the resultant light is incident on the image sensor 210.

Figure 9:
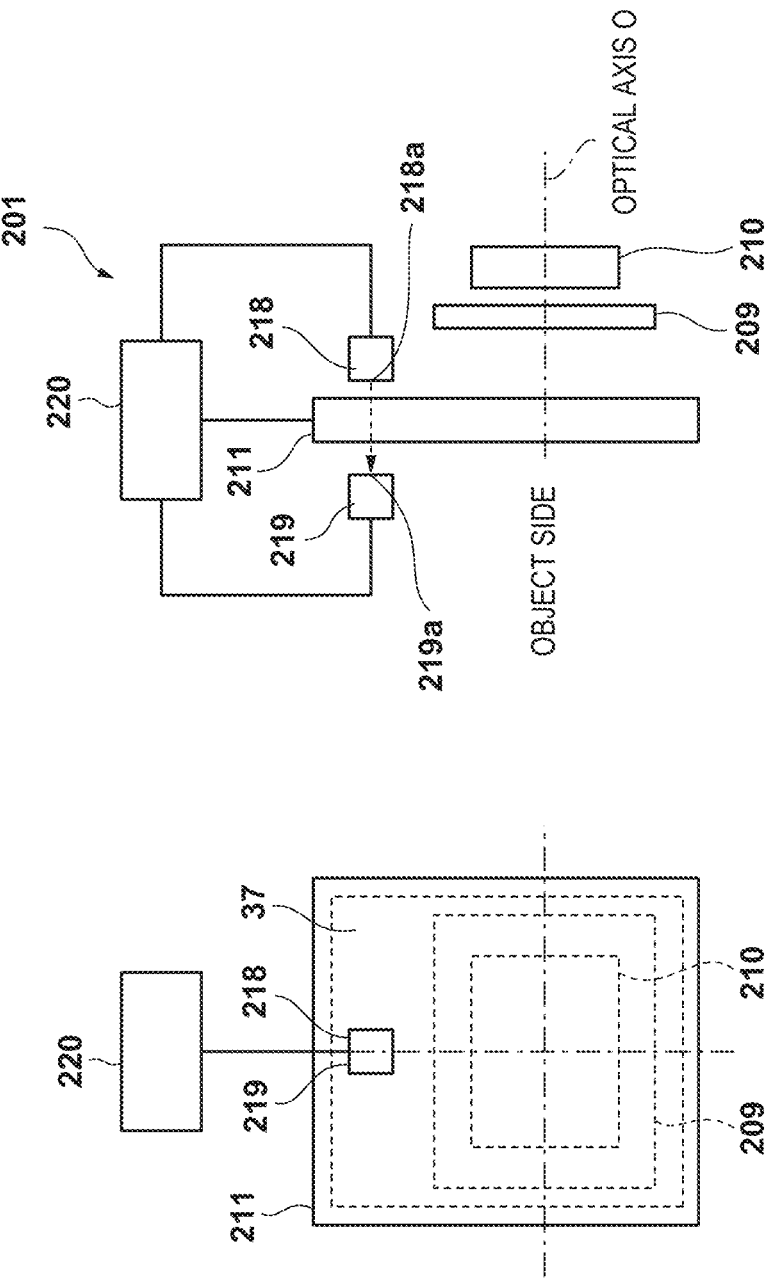
FIGS. 9A and 9B are schematic diagrams showing a light transmittance changeable element, an IR cut filter, and an image sensor according to the second embodiment.

Next, the configuration of the light transmittance changeable element 201 will be described. FIGS. 9A and 9B are schematic diagrams showing the light transmittance changeable element 201, the IR cut filter 209, and the image sensor 210 in this second embodiment. FIG. 9A is a schematic diagram viewed from the front, and FIG. 9B is a schematic diagram showing the cross-section. The light transmittance changeable element 201 in the second embodiment includes an organic EC device 211, an infrared LED 218, a phototransistor 219, and a control circuit 220.

Note that the organic EC device 211 has the same configuration as that described in the first embodiment with reference to FIGS. 2A to 2D, and is capable of changing the transmittance according to the above-described Lambert-Beer's law, and thus a description thereof is omitted.

The infrared LED 218 is an LED (light emitting unit) having a peak light emission wavelength in an infrared light region, and is arranged on the IR cut filter 209 side (image sensor side) with respect to the organic EC device 211, and the peak light emission wavelength is assumed to be 800 nm in this second embodiment. By applying a voltage, the infrared LED 218 emits infrared light from a light emitting portion 218a to the outside. The light emitting portion 218a is arranged on the object side relative to the IR cut filter 209 in the optical axis direction. Thus, the IR cut filter 209 is arranged between the light emitting portion 218a and the image sensor 210. Also, in FIG. 9B, the direction, which is indicated by a dotted arrow, in which the infrared LED 218 emits light is opposite to the direction in which light is incident on the image sensor 210 from the object side. Thus, the infrared light emitted from the light emitting portion 218a is not directly incident on the image sensor 210, and it is possible to reduce the influence of the infrared light on the captured image.

The phototransistor 219 is a phototransistor (detection unit) having sensitivity in a wavelength range including the peak light emission wavelength of the infrared LED 218, and is arranged on the object side with respect to the organic EC device 211. A light receiving surface 219a faces the light emitting portion 218a across the organic EC device 211, receives light emitted by the infrared LED 218, and outputs an electrical signal corresponding to the received light amount.

The control circuit 220 internally includes an external power source, and is electrically connected to the organic EC device 211, the infrared LED 218, and the phototransistor 219. The light emission amount of the light emitting portion 218a can be changed by performing constant current control for controlling the electric current flowing through the infrared LED 218. Also, the transmittance of the organic EC device 211 can be changed by controlling the voltage to be applied to the organic EC device 211 from the external power source in accordance with an electrical signal output from the phototransistor 219.

The light emitted by the infrared LED 218 is attenuated by an amount corresponding to the transmittance of the organic EC device 211, and received by the phototransistor 219. Thus, if the light amount of the infrared LED 218 is kept constant, the light amount detected by the phototransistor 219 and the electrical signal output from the phototransistor 219 change according to the transmittance of the organic EC device 211. That is, the phototransistor 219 is capable of detecting the transmittance of the organic EC device 211.

The control circuit 220 is capable of subjecting the voltage to be applied to the organic EC device 211 to feedback control such that the electrical signal output from the phototransistor 219 approaches a predetermined target value. Thus, even if the characteristics of the organic EC device 211 vary according to the temperature or a coloring time, it is possible to accurately control the transmittance of the organic EC device 211 with respect to the target value.

The infrared LED 218 and the phototransistor 219 are arranged outside the IR cut filter 209 viewed from the front. Also, light is blocked by a light blocking member (not shown) outside the IR cut filter 209 when viewed from the front such that no external light is incident on the camera unit 203 from the outside. Thus, no external light is incident on the phototransistor 219, which will be described later, and only light emitted from the infrared LED 218 is incident thereon. Therefore, an error resulting from the incidence of external light does not occur, and more accurate feedback control is possible.

Figure 10:
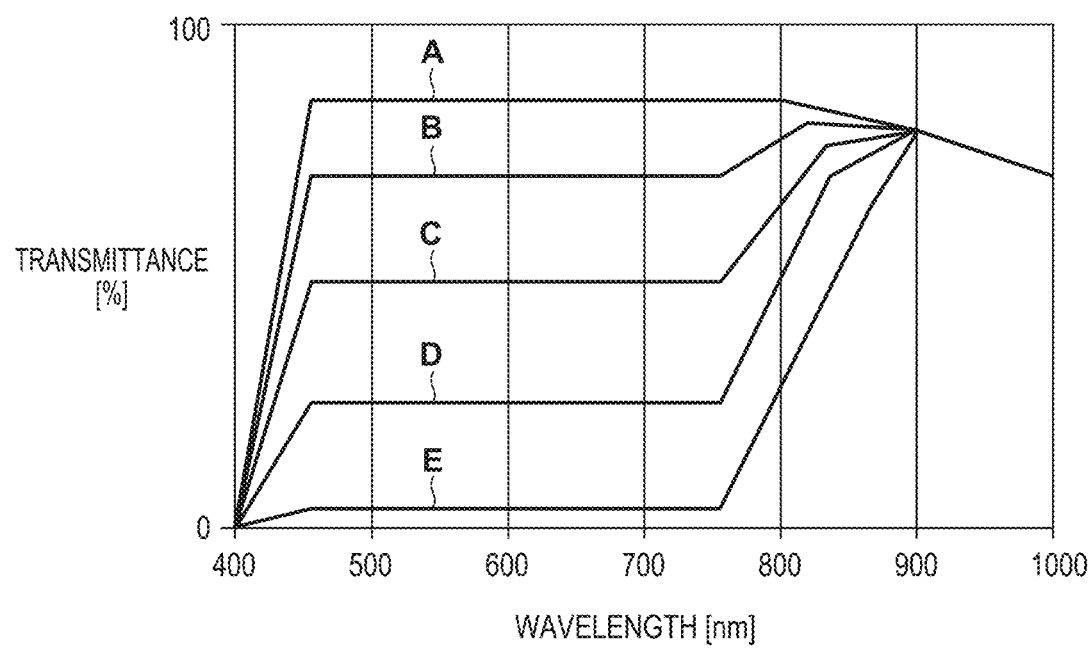
FIG. 10 is a diagram showing a graph that shows a transmittance spectrum of an organic EC device according to the second embodiment.

Next, spectrum characteristics of each member will be described. FIG. 10 is a graph showing the transmittance spectrum of the organic EC device 211. In this second embodiment, the control circuit 220 controls the voltage to be applied to the organic EC device 211 by changing the duty ratio of PWM control. FIG. 10 shows the transmittances at a duty ratio of A %, B %, C %, D %, and E %. The duty ratio has the relationship A<B<C<D<E, and the effective voltage has the relationship A<B<C<D<E. It can be seen that, if the effective voltage to be applied is increased by increasing the duty ratio, the concentration of cations of the organic EC material increases, and the transmittance decreases. The organic EC material of the second embodiment is adjusted such that, by mixing a plurality of materials with different absorption wavelengths, the transmittance in the visible light region becomes uniform, that is, wavelength flatness can be ensured. Thus, the transmittance is approximately uniform at 500 to 700 nm including the center of visible light. Also, a wavelength range in which the transmittance changes according to the applied voltage is 450 to 850 nm, for example.

Although the wavelength range in which the transmittance changes according to the applied voltage can be enlarged by changing the EC materials or the mixing ratio thereof, it becomes difficult to adjust the wavelength flatness of the transmittance. In order to minimize the influence on various characteristics such as the wavelength flatness of the transmittance in the visible light region used to capture an image, it is desirable to adjust the EC materials such that the wavelength range in which the transmittance changes according to the applied voltage approximately coincides with the visible light region.

Figure 11:
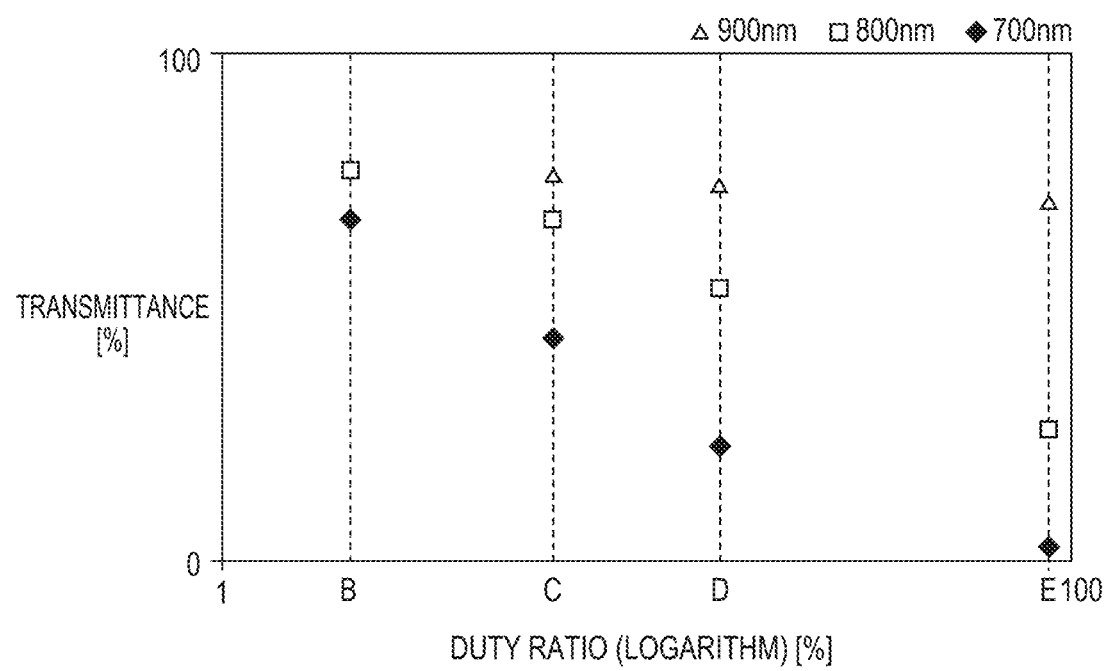
FIG. 11 is a diagram showing a graph that shows relationship between a duty ratio and a transmittance of the organic EC device according to the second embodiment.

FIG. 11 is a graph showing the relationship between the duty ratio and the transmittance of the organic EC device 211. At 700 nm, the transmittance simply decreases in proportion to the logarithm of the duty ratio, and when the duty ratio is increased from B % to E %, the transmittance greatly decreases. Although the amount of change is smaller at 800 nm than at 700 nm, similarly, the transmittance decreases. On the other hand, the transmittance hardly changes at 900 nm, compared to 800 nm. That is, it can be seen that although the transmittance changes at 700 nm and 800 nm in accordance with the duty ratio, that is, the applied voltage, the transmittance hardly changes at 900 nm.

Figure 12:
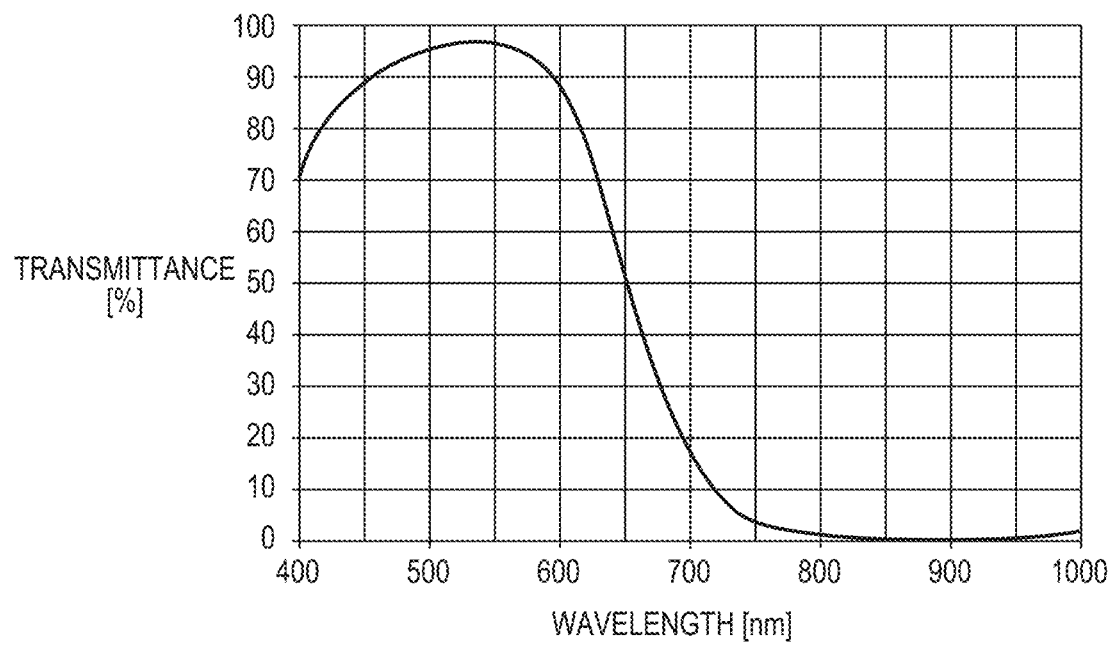
FIG. 12 is a diagram showing a graph that shows a transmittance spectrum of the IR cut filter according to the second embodiment.

FIG. 12 is a graph showing the transmittance spectrum of the IR cut filter 209. The IR cut filter 209 is an absorption type filter with a half wavelength of 650 nm. The transmittance of the IR cut filter 209 is sufficiently low around 800 nm that is the peak wavelength of the infrared LED 218.

Figure 13:
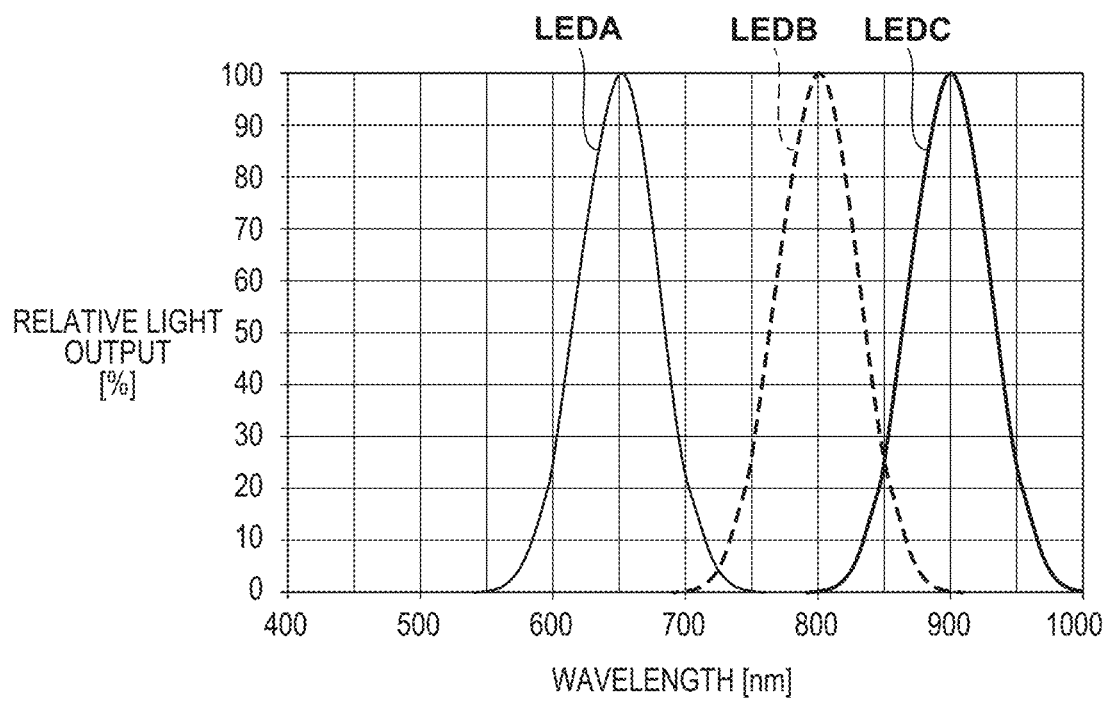
FIG. 13 is a diagram showing a graph that shows an emission spectrum of an LED according to the second embodiment.

FIG. 13 is a graph showing the emission spectrum of the LED. LEDA and LEDC indicate the characteristics of an LED as a conventional example, and LEDB indicates the characteristics of the infrared LED 218 of the second embodiment.

The case where the LED indicated by LEDA as the conventional example is used in the light transmittance changeable element 201 is hypothetically considered. The peak light emission wavelength of LEDA is 650 nm. A normal red LED often has a peak light emission wavelength of about 650 nm, and its characteristics are close to the characteristics of LEDA. As shown in FIG. 12, 650 nm is the half-transmittance wavelength of the IR cut filter 209, and light that is indicated by LEDA and emitted from the LED passes through the IR cut filter 209 to some extent. Thus, if the light emitted from the LED passes through the IR cut filter 209 and reaches the image sensor 210 due to being reflected off the inner surface of the camera unit 203, for example, there is a risk that the captured image will be affected.

Also, the case where the LED indicated by LEDC as the conventional example is used in the light transmittance changeable element 201 is hypothetically considered. The peak light emission wavelength of LEDC is 900 nm. A normal near-infrared LED often has a peak light emission wavelength of about 900 nm, and its characteristics are close to the characteristics of LEDC. However, as shown in FIG. 11, the transmittance of the organic EC device 211 does not change at 900 nm. Thus, the light amount detected at the phototransistor 219 also hardly changes, and accuracy in detecting the transmittance of the organic EC device 211 and performing feedback control decreases.

In view of this, an LEDB is used as the infrared LED 218 in the second embodiment. The peak light emission wavelength in this case is 800 nm. The peak wavelength of the infrared LED 218 is longer than the half-transmittance wavelength 650 nm of the IR cut filter 209, and most of the emitted light is attenuated by the IR cut filter 209. Thus, light that reaches the image sensor 210 from the infrared LED 218 is significantly reduced due to reflection and the like, and the influence on the captured image can be reduced. Also, the peak wavelength of the infrared LED 218 is in a wavelength range in which the transmittance of the organic EC device 211 changes according to the applied voltage, and in particular, the peak wavelength of the infrared LED 218 is shorter than 900 nm at which the transmittance of the organic EC device 211 does not change according to the applied voltage. Thus, if the transmittance of the organic EC device 211 changes according to the applied voltage, the light amount detected at the phototransistor 219 changes. Thus, the transmittance of the organic EC device 211 is detected using the electrical signal output from the phototransistor 219, and feedback control can be performed.

Note that it is also conceivable to use an LED that emits ultraviolet light, instead of the infrared LED 218. Although utilizing ultraviolet light makes it possible to reduce the influence on the captured image, ultraviolet light has a high amount of energy, and there is a risk that the EC materials will be damaged. Thus, with the image capturing apparatus 200 in this second embodiment, using the infrared LED 218 that emits infrared light makes it possible to ensure the reliability of the organic EC device 211 and then detect the transmittance of the organic EC device 211 while reducing the influence on the captured image.

Also, a liquid crystal ND element in which liquid crystal is used may be used as the light transmittance changeable element 201 shown in the present embodiment. If a liquid crystal ND element having transmittance spectrum characteristics that are similar to those of the organic EC device 211 is used, an effect that is similar to that of this second embodiment is obtained.

The organic EC device 211 sometimes has unevenness in the transmittance or wavelength flatness in the plane orthogonal to the optical axis due to partial condensation or gravity. If unevenness occurs, the transmittance or the color of the organic EC device 211 in an image capturing range of the image sensor 210 shown in FIG. 9A is different from the transmittance or the color of the organic EC device 211 in the light receiving surface 219a shown in FIG. 9B, and accurate feedback control cannot be performed. Thus, an unevenness detection unit configured to detect this unevenness may be further provided, and a feedback stop unit configured to stop feedback control of the organic EC device 211 when the unevenness is at a predetermined value or more may be provided. While the feedback control is stopped, so-called open control is performed under which the voltage to be applied to the organic EC device 211 is determined by referring to the table, which is stored in the control circuit 220, indicating relationship between the applied voltages and the transmittances.

The unevenness detection unit may be constituted by a shutter configured to cut external light and a transmittance detection unit configured to detect the transmittance or the wavelength flatness of the organic EC device 211 at a plurality of points in the plane orthogonal to the optical axis. In this case, it is desirable that the infrared LED 218 is prohibited from emitting light or the unevenness detection unit functions as a portion of the transmittance detection unit while the unevenness detection unit is detecting unevenness. Also, the unevenness detection unit may detect unevenness when the power source of the image capturing apparatus 100 is turned ON, or before imaging starts.

As described above, according to the second embodiment, it is possible to perform control to achieve a desired transmittance by detecting the transmittance of the light transmittance changeable element and subjecting the transmittance of the light transmittance changeable element to feedback control based on the detected transmittance.

Third Embodiment

Next, a third embodiment of the present invention will be described. The configuration of the IR cut filter 209 of the image capturing apparatus 200 that was described in the second embodiment is changed in the third embodiment. Thus, the configurations that are the same as those of the second embodiment are given the same reference numerals, and a description thereof is omitted as appropriate.

Figure 14A:
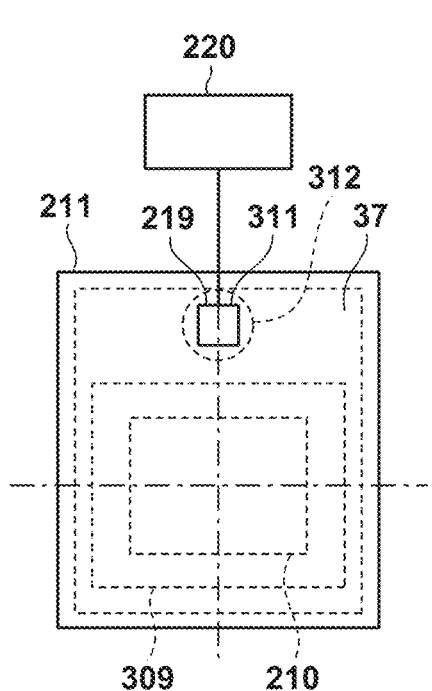
FIGS. 14A and 14B are schematic diagrams showing a light transmittance changeable element, an IR cut filter, and an image sensor according to a third embodiment.
Figure 14B:
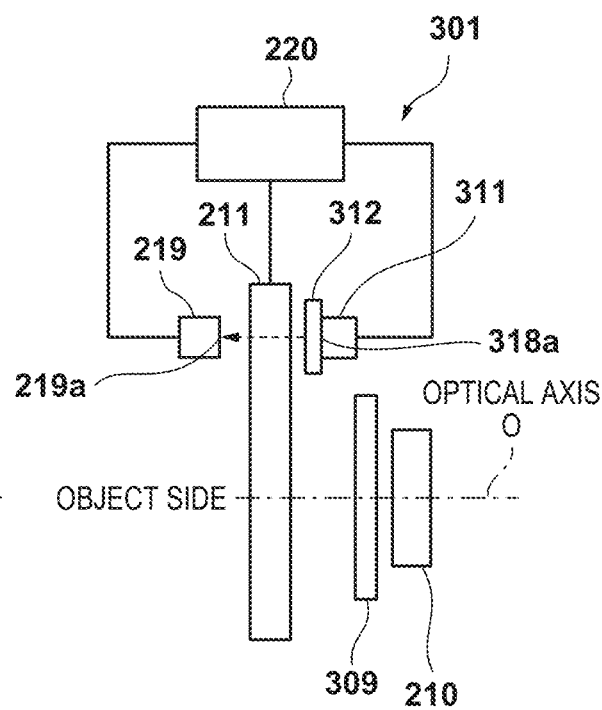

FIGS. 14A and 14B are schematic diagrams showing a light transmittance changeable element 301, an IR cut filter 309, and an image sensor 210 in the third embodiment, and correspond to FIGS. 9A and 9B in the second embodiment. The third embodiment is different from the second embodiment shown in FIGS. 9A and 9B in that the light transmittance changeable element 201 is provided with an infrared LED 311 instead of the infrared LED 218, and a visible light cut filter 312 is added, and the IR cut filter 309 is provided instead of the IR cut filter 209.

The infrared LED 311 is an LED having a peak light emission wavelength of 750 nm which is shorter than the infrared LED 218 in the second embodiment. The IR cut filter 309 is a reflection type filter having a half wavelength of 650 nm. The visible light cut filter 312 is provided so as to overlap with the light emitting portion 318a in the direction in which the infrared LED 311 emits light, and cuts, in the light emitted by the infrared LED 311, light having a wavelength that is less than or equal to a predetermined cutoff wavelength that is shorter than the peak light emission wavelength of the infrared LED 311. The visible light cut filter 312 corresponds to a second optical filter in the claims, and has a cutoff wavelength of 700 nm.

Figure 15:
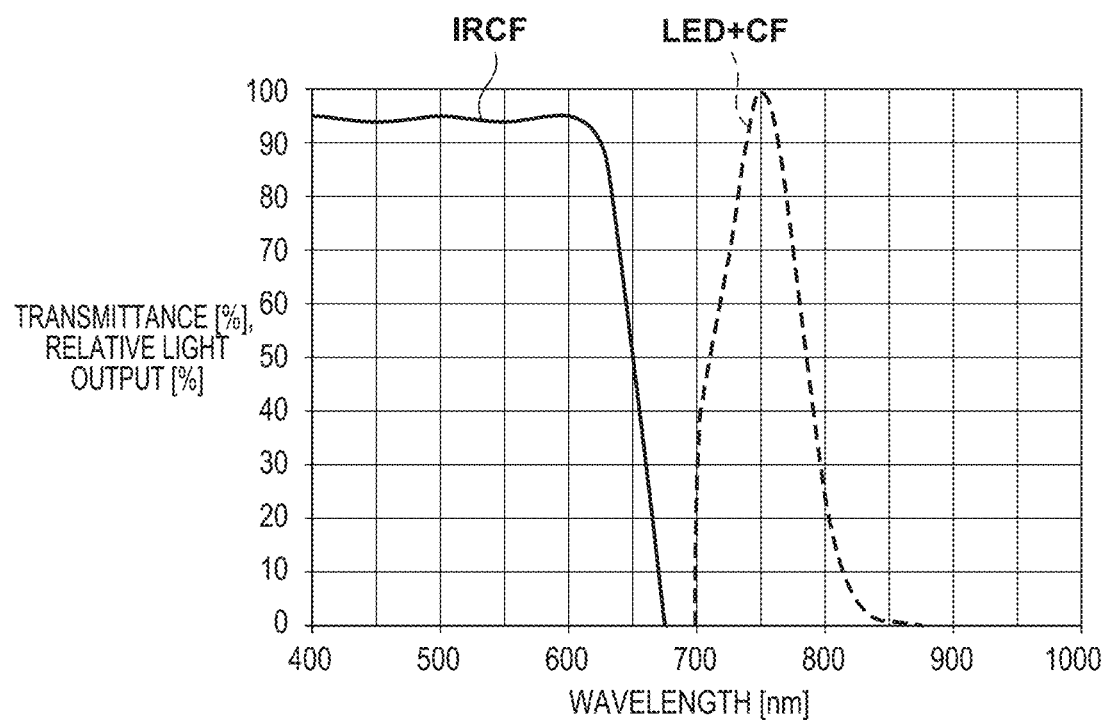
FIG. 15 is a diagram showing a graph that shows a transmittance spectrum of the IR cut filter and an emission spectrum of an infrared LED according to the third embodiment.

FIG. 15 is a graph showing the transmittance spectrum of the IR cut filter 309 and the emission spectrum of the infrared LED 311 in the third embodiment. IRCF indicates the transmittance of the IR cut filter 309. The IR cut filter 309 is a reflection type filter, and exhibits sharper spectrum characteristics with respect to that of the IR cut filter 209 shown in FIG. 7. The transmittance is zero at a wavelength of approximately 675 nm or more. Also, LED+CF indicates the light output from the infrared LED 311 after light has passed through the visible light cut filter 312. The light output is zero at a wavelength of 700 nm or less due to the visible light cut filter 312. That is, the reflected light emitted from the infrared LED 311 is cut by the IR cut filter 309. Thus, similarly to in the second embodiment, the image capturing apparatus of this third embodiment is capable of performing control to achieve a desired transmittance by detecting the transmittance of the light transmittance changeable element and subjecting the transmittance of the light transmittance changeable element to feedback control based on the detected transmittance.

Even if the peak light emission wavelength of the infrared LED is made smaller than that of the second embodiment, similar effects can be obtained in the third embodiment. As shown in FIGS. 6A and 6B, in an infrared range of 700 to 900 nm, the shorter the wavelength is, the more likely the transmittance of the organic EC device 211 is to change according to the applied voltage. Thus, in the third embodiment, a change in the transmittance is easily detected, and more accurate feedback control is possible.

Fourth Embodiment

Next, a fourth embodiment of the present invention will be described. The configuration of the IR cut filter 209 of the image capturing apparatus 200 that was described in the second embodiment is changed in the fourth embodiment. Thus, the configurations that are the same as those of the second embodiment are given the same reference numerals, and a description thereof is omitted as appropriate.

FIGS. 16A and 16B are schematic diagrams showing a light transmittance changeable element 401, an IR cut filter 209, and an image sensor 210 in the fourth embodiment, and correspond to FIGS. 9A and 9B in the second embodiment. The fourth embodiment is different from the second embodiment shown in FIGS. 9A and 9B in that an actuator 413 and a sensor 414 are added.

The actuator 413 is fixed integrally with the image sensor 210 using a member (not shown), and is capable of changing the position of the IR cut filter 209 using an electrical signal or through an operation made by a user photographer (the actuator can be inserted into or removed from the light path). The IR cut filter 209 can be moved by the actuator 413 from an insertion position (indicated by a solid line in FIG. 16B) where it overlaps with the image capturing range of the image sensor 210 viewed in the optical axis direction to a retraction position (indicated by a dashed-dotted line in FIGS. 16A and 16B) where it does not overlap with the image capturing range of the image sensor 210 viewed in the optical axis direction. When the IR cut filter 209 is located at the retraction position, infrared light is incident on the image sensor 210, which is useful for applications such as infrared imaging in a dark place, for example.

The sensor 414 is capable of detecting whether the IR cut filter 209 is located at the insertion position or the retraction position and outputting the detection result as an electrical signal.

Upon detecting that the IR cut filter 209 is located at the retraction position using the output of the sensor 414, a control circuit 415 stops emission by the infrared LED 218, stops feedback control of the organic EC device 211, and performs open control. Under the open control, a voltage to be applied to the organic EC device 211 is determined by referring to the table, which is stored in the control circuit 415, indicating relationship between the applied voltages and the transmittances.

When the IR cut filter 209 is located at the retraction position, the light emitted by the infrared LED 218 is reflected off the inner surface of the camera unit 303, for example, reaches the image sensor 210, and is not attenuated by the IR cut filter 209. Thus, there is a possibility that the captured image obtained by the image sensor 210 will be affected. However, in the fourth embodiment, light emitted by the infrared LED 218 is stopped by detecting that the IR cut filter 209 is located at the retraction position, and thus the influence on the captured image can be reduced.

As described above, according to the fourth embodiment, an effect that is similar to that of the second embodiment can be obtained.

Fifth Embodiment

Next, a fifth embodiment of the present invention will be described. First, a conceptual configuration of an image capturing apparatus in the fifth embodiment will be described with reference to FIGS. 17A, 17B, and 18.

Figure 17A:
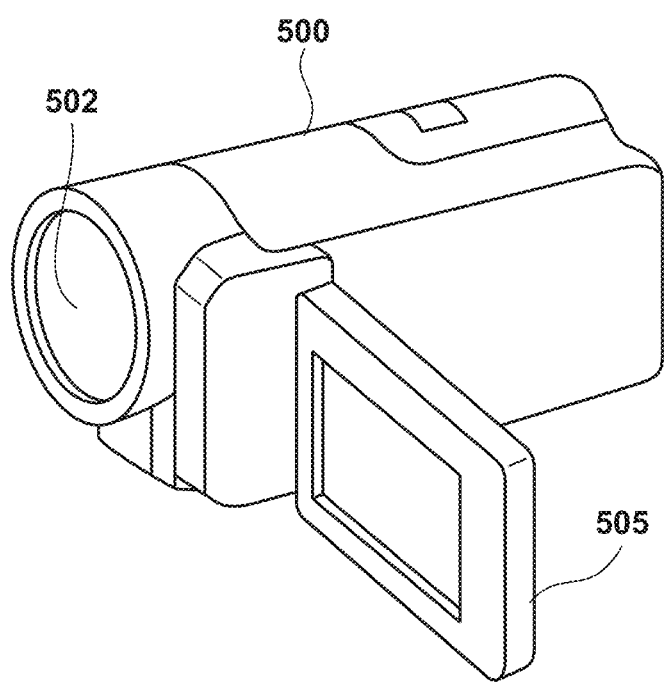
FIGS. 17A and 17B are schematic diagrams showing a schematic configuration of an image capturing apparatus according to a fifth embodiment.
Figure 17B:
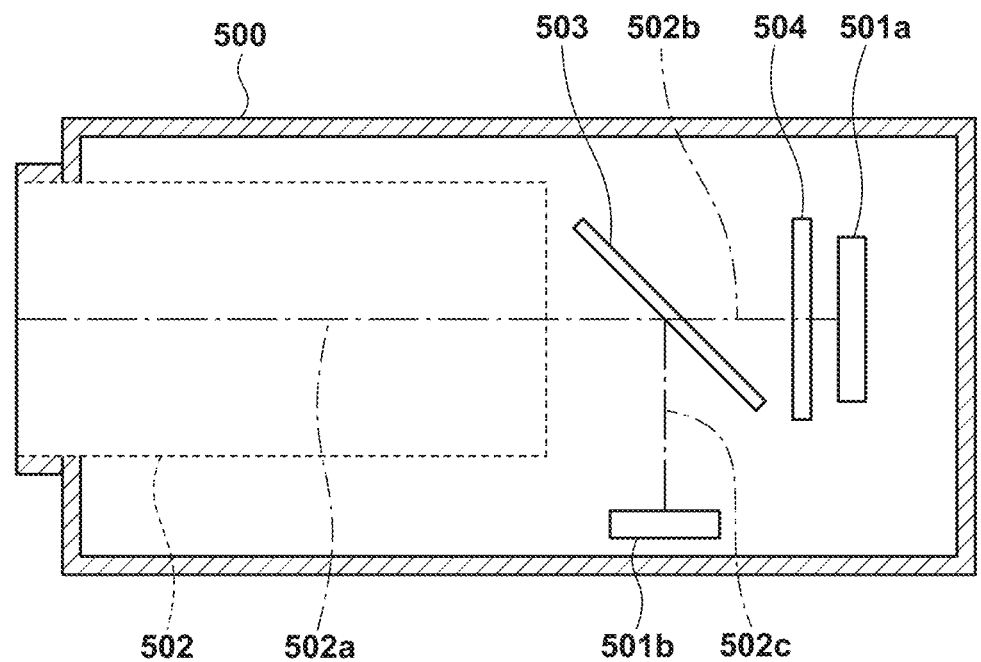

FIGS. 17A and 17B are schematic diagrams showing a schematic mechanical configuration of an image capturing apparatus 500 in the fifth embodiment. FIG. 17A is an oblique projection drawing of an external appearance, and FIG. 17B is a schematic cross-sectional view. In FIGS. 17A and 17B, the image capturing apparatus 500 includes a first image sensor 501a, a second image sensor 501b, a lens group 502 (image capturing optical system), a beam splitter 503 (separation unit), a light transmittance changeable element 504 corresponding to a transmissive optical element, and a display unit 505. Reference numerals 502a to 502c are image capturing optical axes. Note that, although the image capturing apparatus 500 in the fifth embodiment additionally includes various operation members and various members such as electronic components for performing various calculations and controls and a heat dissipation member, these members are not main portions of the present invention, and thus are not depicted in FIGS. 17A and 17B.

Both the first image sensor 501a and the second image sensor 501b in the fifth embodiment photoelectrically convert subject light that is condensed by the lens group 502 to form an image, and output image signals. Out of these image sensors, the first image sensor 501a corresponds to an image sensor for capturing a still image or a moving image in a normal image capturing apparatus, and a common CMOS sensor, CCD sensor, or the like may be utilized. On the other hand, although details will be described later, the second image sensor 501b is utilized supplementally to the first image sensor 501a in the present invention, and a common CMOS sensor. CCD sensor, or the like, a position sensitive detector (PSD) capable of acquiring a light intensity distribution in a two-dimensional plane, an AE sensor for automatic photometry, or the like may be utilized. Note that there is no limitation on the types of first image sensor 501a and second image sensor 501b.

The beam splitter 503 is arranged on the image capturing optical axis 502a of the lens group 502, and allows passage of a part of the image capturing luminous flux (not shown) that passes through the lens group 502, and reflects part of the image capturing luminous flux, thereby splitting the image capturing luminous flux into two main luminous fluxes. Accordingly, the image capturing optical axis 502a is split into two, and thus the optical axis that has passed through the beam splitter 503 is given reference numeral 502b and the optical axis that is reflected thereby is given reference number 502c in FIG. 17B. Furthermore, the first image sensor 501a and the second image sensor 501b are arranged so as to be respectively located on the image capturing optical axes 502b and 502c.

The light transmittance changeable element 504 is fixed within the image capturing optical axis 502b, and controls the amount of the image capturing luminous flux (not shown) that passes through the lens group 502 and the beam splitter 503, and forms an image on the first image sensor 501a. A liquid crystal element or the organic electrochromic (EC) device that was described with reference to FIGS. 2A to 2D may be utilized as such a light transmittance changeable element 504, for example.

Both the first image sensor 501a and the second image sensor 501b capture the luminous flux that is condensed by the lens group 502 to form an image, and thus are arranged at positions where their light path lengths from the lens group 502 are approximately equal to each other, on the image capturing axes 502b and 502c.

With the above-described configuration, the image capturing apparatus 500 of the fifth embodiment is capable of simultaneously acquiring two types of images, namely, a first image obtained by imaging the luminous flux that is condensed by the lens group 502 to form an image and has passed through the light transmittance changeable element 504, and a second image obtained by imaging the luminous flux that is condensed by the same lens group 502 and does not pass through the light transmittance changeable element 504.

Figure 18:
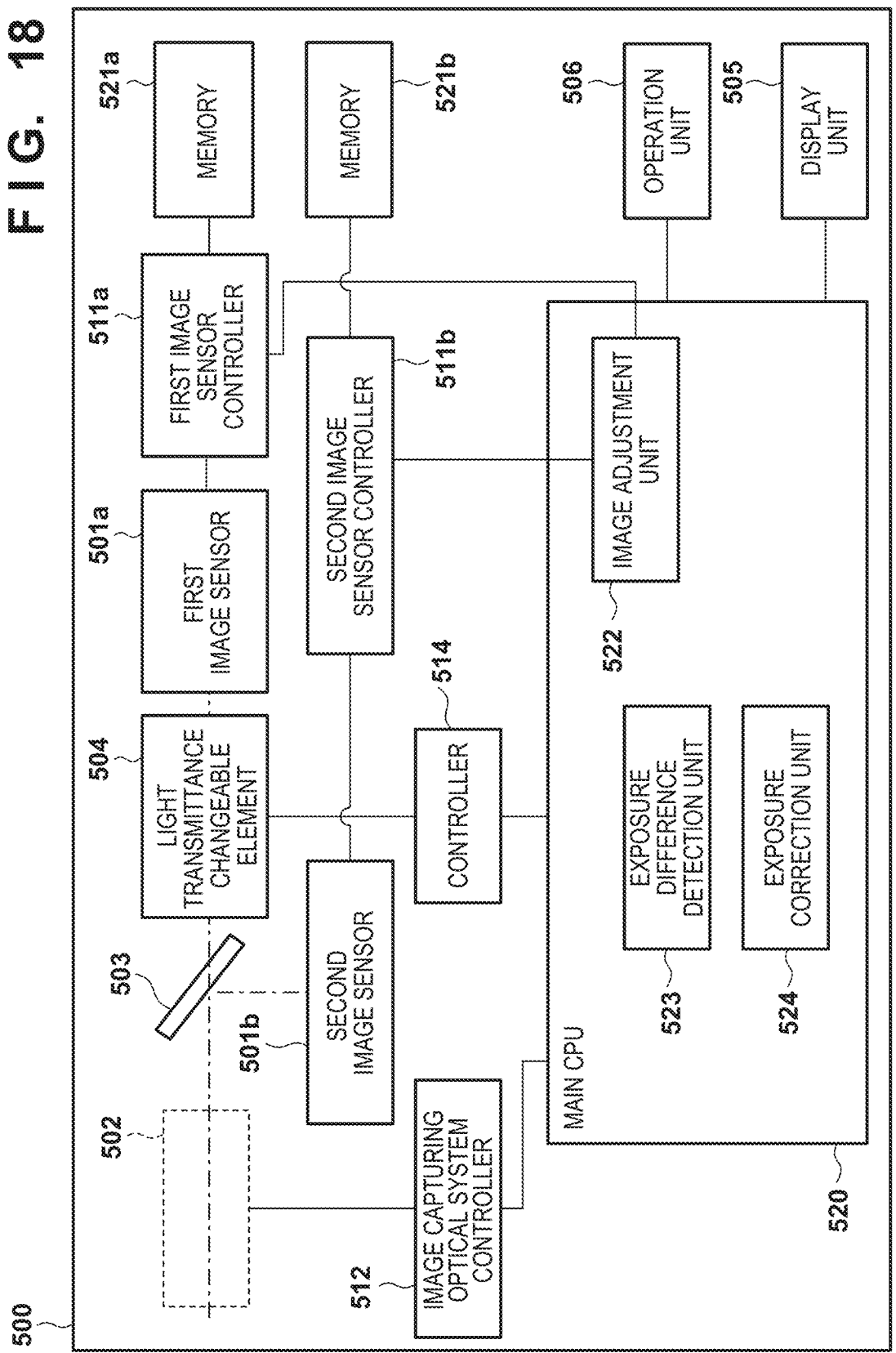
FIG. 18 is a block diagram showing a functional configuration of an image capturing apparatus according to the fifth embodiment.

FIG. 18 is a block diagram showing the functional configuration of the image capturing apparatus 500. Note that the configurations that are the same as those shown in FIGS. 17A and 17B are given the same reference numerals in FIG. 18. In FIG. 18, a first image sensor controller 511a and a second image sensor controller 511b respectively control the first image sensor 501a and the second image sensor 501b. Also, an image capturing optical system controller 512 controls the lens group 502, and a light transmittance changeable element controller 514 controls the transmittance of the light transmittance changeable element 504. Furthermore, the image capturing apparatus 500 includes a main CPU 520, a first memory 521a, a second memory 521b, an image adjustment unit 522, an exposure difference detection unit 523, and an exposure correction unit 524. In addition, the image capturing apparatus 500 of this fifth embodiment includes various calculation units and controllers, but these units are not main portions of the present invention, and thus a description thereof is omitted in FIG. 18.

The main CPU 520 performs main calculation and control during various operations such as imaging and setting in the image capturing apparatus 500. For example, the main CPU 520 directly or indirectly performs control for driving units related to various types of imaging by outputting control signals to the first and second image sensor controllers 511a and 511b, the image capturing optical system controller 512, the light transmittance changeable element controller 514, the display unit 505, and the like. Also, the main CPU 520 may acquire image signals output by the first and second image sensors 501a and 501b through the first and second image sensor controllers 511a and 511b, and perform various types of image processing.

The image adjustment unit 522, the exposure difference detection unit 523, and the exposure correction unit 524 detect and correct an exposure error related to the image captured by the first image sensor 501a. This fifth embodiment will be described assuming that these configurations are implemented as portions of the functions of the main CPU 520, but these configurations may be implemented as separate independent controllers.

The light transmittance changeable element 504 is constituted by the organic EC device described with reference to FIGS. 2A to 2D, a liquid crystal element, or the like, for example. By incorporating such a light transmittance changeable element 504, the image capturing apparatus 500 is capable of various imaging expressions and high-quality moving image capturing of many scenes utilizing the light transmittance changeable element 504. Meanwhile, with the light transmittance changeable element 504, a density error occurs during operation, that is, a density deviation in which the overall density deviates from the intended level, density unevenness in which density differences occurs depending on positions in the transmission plane, and the like occur sometimes. In such a case, there is a possibility that an exposure error, that is, an exposure deviation or exposure unevenness will be superimposed on an image to be captured.

In particular, the light transmittance changeable element 504 including the organic EC device having the configuration described with reference to FIGS. 2A to 2D uses a density control principle utilizing the electrochemical reaction of the materials, and thus is likely to be affected by temperature. For example, if the image capturing apparatus 500 is left in a high-temperature environment for a long time, there is a possibility that the overall temperature will increase and mainly a density deviation will occur. Also, for example, if a moving image is captured using the image capturing apparatus 500 for a long time, there is a possibility that an internal electronic component will generate a large amount of heat, and the generated heat will be locally transmitted to the light transmittance changeable element 504, resulting in density unevenness.

The image capturing apparatus 500 has a configuration and a correction method capable of highly accurately correcting the influence of an exposure error that is to be superimposed on an image to be captured, even if a density error of the light transmittance changeable element 504 occurs as described above. Next, details of the exposure error described above and a method for correcting the exposure error will be described.

Figure 19A:
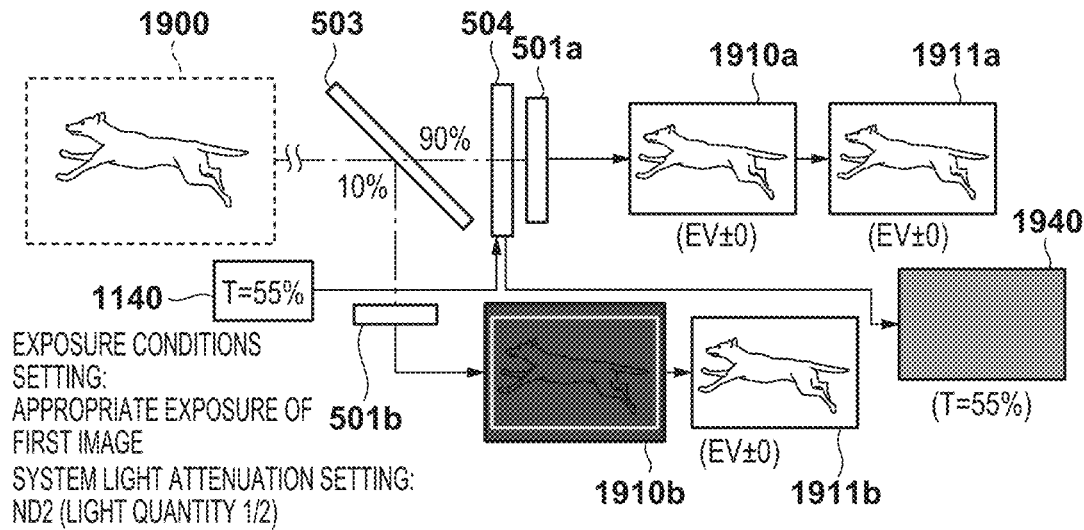
FIGS. 19A to 19C are schematic diagrams showing density states of the light transmittance changeable element and exposure states of first and second images that are obtained from first and second image sensors according to the fifth embodiment.
Figure 19B:
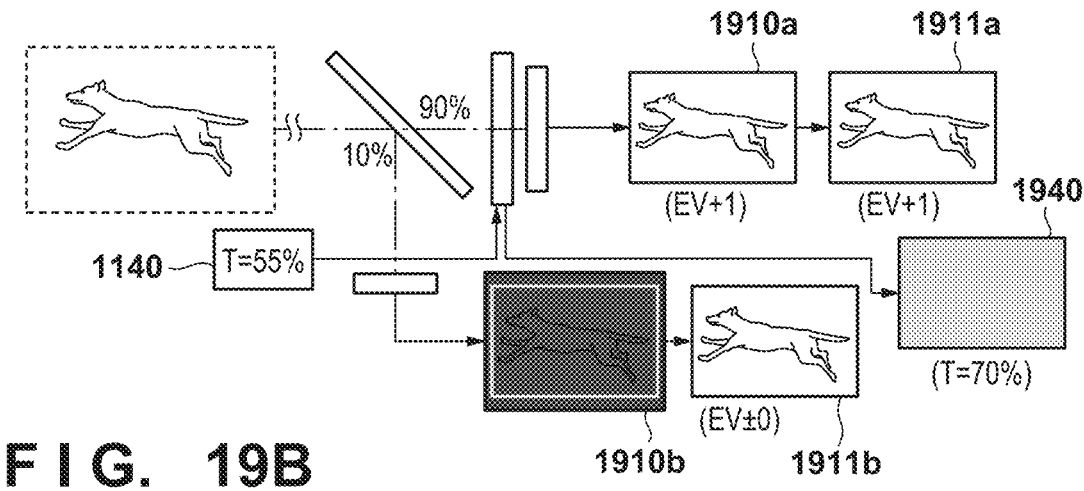
Figure 19C:
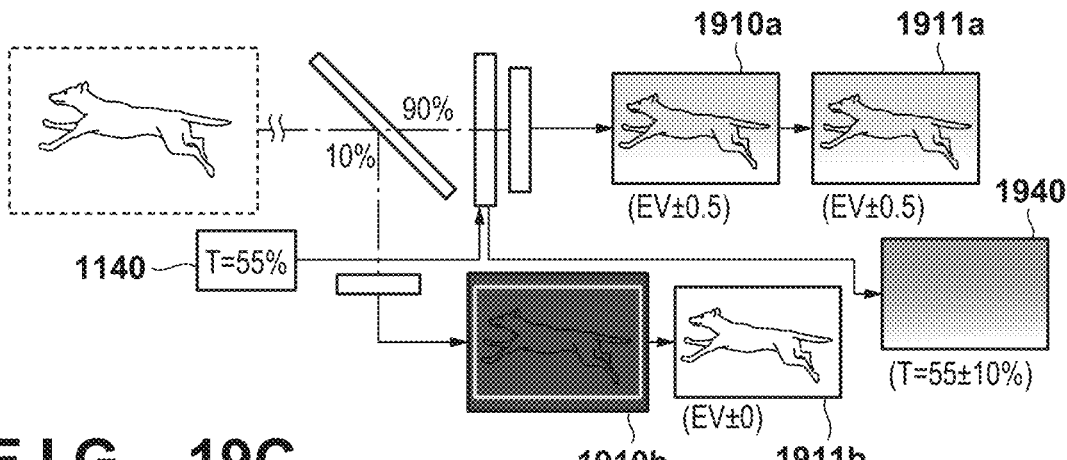

FIGS. 19A to 19C are schematic diagrams illustrating an exposure error occurrence principle in the image capturing apparatus 500 in the fifth embodiment. Schematic diagrams of exposure states of first and second images that are obtained from the first and second image sensors 501a and 501b during various types of imaging, and the density states of the light transmittance changeable element 504 are shown. In FIGS. 19A to 19C, reference numeral 1900 indicates a subject, reference numeral 1910a indicates a first image that is obtained from the first image sensor 501a prior to image adjustment that will be described later and is performed by an image adjustment unit 522, and reference numeral 1910b indicates a second image that is obtained from the second image sensor 501b prior to image adjustment. Reference numerals 1911a and 1911b respectively indicate the first and second images that have undergone image adjustment. Also, reference numeral 1140 indicates a driving instruction value of the light transmittance changeable element 504, and reference numeral 1940 indicates a schematic diagram of an actual density state of an image capturing region in the transmission plane of the light transmittance changeable element 504. Note that the size of the images and the schematic diagram of the light transmittance changeable element 504 is for the sake for the description, and does not reflect the actual magnitude relationship.

Also, in order to facilitate the following description, indexes of an exposure state and a density state are also shown using numerical values in the images and the schematic diagram of the light transmittance changeable element 504 in FIGS. 19A to 19C. The index of the exposure state of the image is a difference between EV values, and EV±0 indicates an appropriate exposure state, that is, indicates a state in which the intended brightness is obtained. In contrast, EV+ indicates an overexposure state, that is, indicates an excessive brightness state, whereas, EV− indicates an underexposure state, that is, indicates an insufficient brightness state. Also, the index of the density state of the light transmittance changeable element 504 is transmittance (a total light beam average, abbreviation is T). Note that the influence of exposure and density unevenness on both the images and the light transmittance changeable element 504 in the plane are expressed conceptually using positive or negative numerical values. For example, the case where a numerical value is +0 indicates that there is no exposure or density unevenness.

Furthermore, spectral percentages (ratios between transmitted light amount and reflected light amount) of the beam splitter 503 are appended to FIGS. 19A to 19C using numerical values. In the fifth embodiment, the first image 1910a obtained from the first image sensor 501a is the main image to be captured, and thus the beam splitter 503 is set such that the percentage of the luminous flux that passes through the beam splitter 503 is as large as possible, the luminous flux that has passed through serving as the luminous flux for capturing the first image 1910a.

FIG. 19A shows a state in which the light transmittance changeable element 504 operates as intended and no density error occurs, FIG. 19B shows a state in which a density deviation occurs in the light transmittance changeable element 504, and FIG. 19C shows a state in which density unevenness occurs in the light transmittance changeable element 504. In FIGS. 19A to 19C, the images show exposure states before exposure correction that will be described later is performed.

In FIGS. 19A to 19C, a scene in which a dog running outdoors in the daytime is subjected to follow-shooting as a subject 1900 with long exposure is assumed as one example of the scene in which the light transmittance changeable element 504 usefully functions in the image capturing apparatus 500. Although the light amount is excessive and an image to be captured is overexposed in such a scene in some cases, by operating the light transmittance changeable element 504 to attenuate the imaging luminous flux, imaging is possible with an appropriate exposure. In FIGS. 19A to 19C, as examples of the settings, the quantity of imaging light is halved, that is, the light attenuation setting as the system of the image capturing apparatus 500 is set to ND2. FIGS. 19A to 19C show the state assuming that various exposure conditions (the aperture, exposure time, ISO sensitivity, and the like of lens group 502) are manually set through an operation unit 506 such that the first image 1911a can be obtained with an appropriate exposure state (EV±0). "Manual" herein refers to a state in which the exposure conditions are manually set in accordance with the subject luminance measured using a separate photometric apparatus without using an automatic photometric (AE) unit (not shown) incorporated in the image capturing apparatus 500.

In FIGS. 19A to 19C, in order that for the light attenuation to be ND2 as the system, a driving instruction is issued such that the light transmittance changeable element 504 has a transmittance of approximately 55% (T=55%).

Herein, in the fifth embodiment, the image capturing luminous flux is split into two by the beam splitter 503, and imaged. Thus, the exposure state of the first image 1910a before image adjustment is darker than that imaged under the same exposure conditions using a common image capturing apparatus that does not include the beam splitter 503, even in the case where light attenuation processing is not performed in the light transmittance changeable element 504 (the case where the transmittance is 100%). Also, except under limited conditions, the exposure of the second image 1910b does not coincide with the exposure of the first image 1910a. Furthermore, the image capturing range of the second image 1910b does not coincide with the image capturing range of the first image 1910a unless an image sensor with the same size as the first image sensor 501a is used as the second image sensor 501b. Thus, it is desirable that various image adjustments are performed by the image adjustment unit 522 on the first and second images 1910a and 1910b that are obtained from the first and second image sensors 501a and 501b so that the exposures thereof coincide with each other and the image capturing ranges thereof coincide with each other, before saving or comparison processing, which will be described later, is performed.

Sensitivity adjustment (gain adjustment) may be performed on the first and second images 1910a and 1910b as the specific content of image adjustment such that the light amount reduced through reflection and the transmission of the beam splitter 503 is recovered. Furthermore, sensitivity adjustment (gain adjustment) may be performed such that the light transmittance changeable element 504 is virtually used to image the second image 1910b and the exposure of the second image 1910b coincides with the exposure of the first image 1910a. Also, trimming and enlargement/reduction (of the resolution of the image) may be performed on the second image 1910b such that the image capturing range of the second image 1910b for correction coincides with the image capturing range of the first image 1910a. These image adjustment parameters may be uniquely determined based on the design content and the adjustment result during assembly of the beam splitter 503 and the second image sensor 501b in the image capturing apparatus 100, and the driving instruction content of the light transmittance changeable element 504. Also, individual processing such as sensitivity adjustment, trimming, and enlargement/reduction uses a basic image processing method, and thus a detailed description is omitted.

Note that when image adjustment is performed, if the light attenuation setting of the first image 1910a is set as the system so as to be larger than the amount of reduction in the light amount of the first image 1910a by the beam splitter 503, the light transmittance changeable element 504 may be driven as follows. That is, a configuration may be adopted in which the amount of reduction made by the beam splitter 503 is subtracted and the light transmittance changeable element 504 is driven without performing sensitivity adjustment processing (gain up) on the first image 1910a in the above-described image adjustment. In this case, because sensitization processing is not performed, a higher-quality image can be obtained in terms of gradation retention and antinoise measures. Such processing is performed on the first image 1911a shown in FIGS. 19A to 19C, and accordingly, under the conditions shown in FIGS. 19A to 19C, the first images 1910a and 1911a are similar to each other before and after the image adjustment. Also, in FIGS. 19A to 19C, the second image 1910b before image adjustment is subjected to gain up according to the spectral ratio of the beam splitter 503 and the density setting of the light transmittance changeable element 504, trimming, and enlargement/reduction in accordance with the first image 1911a, and becomes an adjusted image 1911b.

In contrast, in the conditions shown in FIG. 19B under which a density deviation in which the density of the light transmittance changeable element 504 is denser than an indicated value occurs, the first images 1910a and 1911a before and after image adjustment are affected by the density deviation and take on a state in which an exposure deviation is superimposed, resulting in the first image being darker than the assumed image. On the other hand, the second image 1910b before image adjustment is obtained by imaging a luminous flux that does not pass through the light transmittance changeable element 504 (luminous flux reflected by the beam splitter 503), and thus the exposure deviation is not superimposed. Furthermore, image adjustment is performed based on the content for instructing driving of the light transmittance changeable element 504, and thus the exposure deviation is not superimposed on the second image 1911b that has undergone the image adjustment, and it is possible to obtain an image that is similar to that in the case shown in FIG. 19A.

Similarly, in the conditions shown in FIG. 19C under which the light transmittance changeable element 504 has density unevenness, the first image 1911a that has undergone the image adjustment is affected by the density unevenness to be in a state in which exposure unevenness is superimposed, whereas exposure unevenness is not superimposed on the second image 1911b that has undergone the image adjustment and an image that is similar to that in the case shown in FIG. 19A is obtained.

Although the case where density deviation and density unevenness individually occur in the light transmittance changeable element 504 has been described so far, in reality, these sometimes occur simultaneously. In such case, the exposure deviation and the exposure unevenness are superimposed on the first image 1911a simultaneously, but they are not superimposed on the second image 1911b and an image in an appropriate exposure state that is similar to that shown in FIG. 19A is obtained.

In view of the above, in the image capturing apparatus 500 of the present embodiment, even when a density error occurs in the light transmittance changeable element 504 and an exposure error is superimposed on the first image 1911a, the second image 1911b is an image with no exposure error. Thus, the second image 1911b is used as a criterion for an appropriate exposure state, and drive control is performed on the light transmittance changeable element 504 and exposure correction is performed on the first image such that a difference between the second image 1911b and the first image 1911a is eliminated. Accordingly, it is possible to correct the influence of the exposure error that is to be superimposed on the first image 1911a.

Figure 20A:
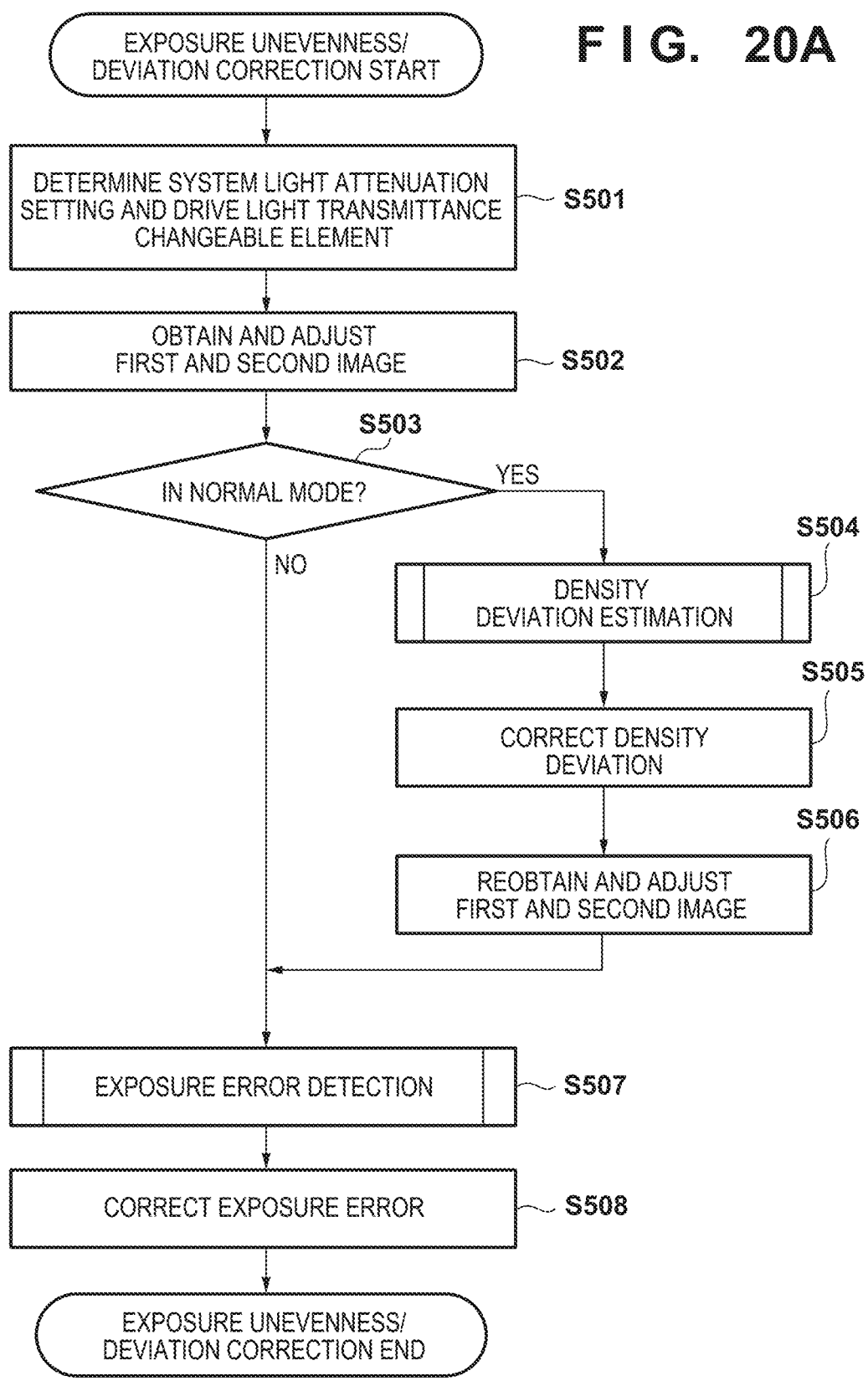

FIGS. 20A to 20C are flowcharts illustrating a method for correcting an exposure error that is superimposed on the first image 1911a in the image capturing apparatus 500 in the fifth embodiment. FIG. 20A shows a main routine for correction, and FIGS. 20B and 20C are its subroutines. The processes shown in FIGS. 20A to 20C are executed by the exposure difference detection unit 523 and the exposure correction unit 524, which are functions of the main CPU 520.

First, the main routine shown in FIG. 20A will be described while referring to the examples described with reference to FIGS. 19A to 19C. The main routine can be applied each time a still image is captured, or one frame of a moving image is captured. In the correction method in the present embodiment, two different modes including a high-speed mode and normal mode can be selected, and thus when correction is performed while performing imaging using the image capturing apparatus 500, either the high-speed mode or the normal mode is selected in advance. Although details will be described later, in the former high-speed mode, priority is given to shorten a time period required for correction and some steps for high accuracy are skipped. Thus, for example, when correction needs to be executed at a high frequency when sequentially capturing still images or capturing a moving image, the high-speed mode may be applied.

Before correction, first, in step S501, a system light attenuation setting is determined, and the light transmittance changeable element 504 is driven according to the determined settings. This processing corresponds to performing drive control such that the system light attenuation setting is ND2 and the light transmittance changeable element 504 has a transmittance of 55% in the examples shown in FIGS. 19A to 19C. If there has been no change since the previous flow execution, step S501 can be skipped.

Next, in step S502, the first image 1911a on which image adjustment is performed by the image adjustment unit 522, and the second image 1911b are acquired. These images are those before exposure error correction is performed.

Next, it is determined in step S503 whether or not the normal mode is used. If the normal mode is used, the processing proceeds to step S504, and if the high-speed mode is used instead of the normal mode, the processing proceeds to step S507. In step S504, density deviation estimation processing for estimating, in particular, the magnitude of a density deviation component in a density error of the light transmittance changeable element 504 is performed by comparing the first image 1911a and the second image 1911b using the exposure difference detection unit 523, as the processing in the normal mode. Although detailed density deviation estimation processing will be described later with reference to FIG. 20B, it is possible to derive a density deviation correction amount for setting the density deviation component of the light transmittance changeable element 504 to 0 through this processing. After the density deviation estimation processing, the processing proceeds to step S505, and the exposure correction unit 524 performs density deviation correction on the light transmittance changeable element 504.

In step S505, a driving instruction value 1140 is updated by the exposure correction unit 524 as the density deviation correction on the light transmittance changeable element 504. Accordingly, the density is corrected by controlling the voltage that is applied from the light transmittance changeable element controller 514 to the light transmittance changeable element 504. Thereafter, the processing proceeds to step S506, and the first image 1911a and the second image 1911b are acquired again. Because the density deviation correction is performed in step S505, the first image 1911a acquired here has a smaller exposure deviation component included in the exposure error, compared to the first image 1911a acquired in step S502.

Next, in step S507, exposure error detection processing is performed in which exposure deviation and exposure unevenness components that are superimposed on the first image 1911a are collectively detected by the exposure difference detection unit 523 by comparing the first image 1911a and the second image 1911b. Although detailed exposure error detection processing will be described later with reference to FIG. 20C, it is possible to derive an exposure correction amount per predetermined divided region of the first image 1911a through this processing. Thereafter, the processing proceeds to step S508, and exposure error correction is performed by the exposure correction unit 524.

In step S508, gain adjustment is performed as the exposure error correction on each divided region of the first image 1911a by the exposure correction unit 524. Accordingly, the first image 1911a whose exposure error has been corrected is obtained, and correction is completed.

Next, density deviation estimation processing performed in step S504 will be described with reference to FIG. 20B. In the density deviation estimation processing, first, in step S511, with regard to each of the first and the second images 1911a and 1911b, an average exposure value is derived as the overall image (for example, EV+1 and EV±0). At this time, various weighting processes such as center weighting and measurement point weighting may also be performed. Next, the processing proceeds to step S512, and a difference between the derived exposure values of the first and second images is obtained (for example, ΔEV+1). Furthermore, the processing proceeds to step S513, and the resulting difference is converted into a density difference value (for example, ΔT=50%). Thereafter, the processing proceeds to step S514, a density deviation correction amount (for example, an indicated value of the transmittance or a voltage value) for performing drive control on the light transmittance changeable element 504 is estimated such that the density difference value is applied. The density deviation estimation processing is completed through the above-described processing, and the density deviation correction amount can be output.

Next, exposure error detection processing performed in step S507 will be described with reference to FIG. 20C. In the exposure error detection processing, first, in step S521, the first and second images 1911a and 1911b are virtually divided into predetermined regions for detecting exposure unevenness. Next, the processing proceeds to step S522, and an average exposure value of each region is calculated. Then, the processing proceeds to step S523, and an exposure difference is obtained for each region. The exposure error detection processing is completed through the above-described processing, and the exposure correction amount of each region can be output.

FIG. 21 is a schematic diagram showing a situation in which the exposure error of the first image 1910a is corrected through the processing shown in the flowcharts of FIGS. 20A to 20C. FIG. 21 shows the processing content in the normal mode. Herein, for the sake of illustration, EV values that serve as the indexes for the exposure state and the transmittances T that serve as the indexes for the density state are shown superimposed on the schematic diagrams of the first and second images 1911a and 1911b and the light transmittance changeable element 504 in each step. Also, similarly to FIGS. 19A to 19C, exposure unevenness and density unevenness are conceptually expressed using positive or negative numerical values.

First, a system light attenuation setting is performed in step S501. The example shown in FIG. 21 shows the state in which, when the imaging condition where the light transmittance changeable element 504 has a transmittance of 100% is set, the exposure value of a first image 2110a is an overexposure of EV+1, and thus the system light attenuation setting is set to ND2. Obtaining a first image 2101a with an appropriate exposure state of EV±0 in this manner is assumed. Hereinafter, numerical values are similar to those shown in FIGS. 19A to 19C.

Next, in step S502, the state is shown in which, when the system light attenuation settings are set to ND2, the density control instruction is designated such that the light transmittance changeable element 504 has a transmittance of 55%, but the actual density state deviates from 55% to a transmittance of 70% and unevenness also occurs. In this state, an exposure deviation and exposure unevenness are superimposed on the first image 2011a, and the exposure state does not become EV±0 that is originally intended. On the other hand, the second image 2011b becomes EV±0, and it is possible to obtain an originally intended appropriate exposure.

Next, the processing proceeds to step S504, and density deviation estimation processing is performed by the exposure difference detection unit 523 by comparing the first image 2011a and the second image 2011b. An exposure difference value $\Delta EV_1$ (=approximately 0.5) is obtained though exposure difference calculations shown in steps S511 to S512, and a density difference value ΔT (=20%) is obtained through processing for converting the obtained value into a density difference in step S513. Then, after density deviation correction is performed on the light transmittance changeable element 504 in step S505, the processing proceeds to step S506, and an image is acquired again.

In step S506, a state is shown in which transmittance of 35% was instructed as the density control instruction after the density deviation correction is performed on the light transmittance changeable element 504, and the light transmittance changeable element 504 has a transmittance of 58% as its density state according to the instruction. That is, compared to the density state (T=70%) before the correction, the transmittance is close to the initially intended value (T=55%), and the density deviation is reduced. An exposure deviation (EV+0.1) that is smaller than the first image 2011a obtained in step S502 and exposure unevenness (EV±β') are superimposed on the first image 2112a in this state. On the other hand, similarly to the case in step S502 above, the second image 2112b has EV±0, and it is possible to obtain an image with an originally intended appropriate exposure.

Next, the processing proceeds to step S507, and exposure error estimation processing is performed by the exposure difference detection unit 523 by comparing the first image 2112a and the second image 2112b. An exposure difference value $\Delta EV_2$ (=0.1±β') including information regarding the divided regions of the first image 2112a is obtained through exposure difference calculation processing performed on each region in steps S521 to S523.

Lastly, the processing proceeds to step S508, an exposure deviation and exposure unevenness are finally corrected by performing sensitivity adjustment on each region of the first image 2112a based on the exposure difference value $\Delta EV_2$, and it is possible to obtain a first image 2113a that is approximately equal to the first image 2101a that was initially assumed.

As described above, in the correction processing shown in FIGS. 20A to 20C and 21, in the case of the normal mode, after the density deviation correction is firstly performed on the light transmittance changeable element 504, exposure deviation correction is performed on the first image 1911a through the minimum sensitivity adjustment. Thus, the normal mode is advantageous in terms of gradation and low noise, and a highly accurate correction result can be obtained, compared to the case of the high-speed mode.

As described above, with the correction method in the fifth embodiment, correction is performed by acquiring and comparing a first image obtained by imaging the luminous flux that has passed through the transmissive optical element and a second image obtained by imaging the luminous flux that does not pass through the transmissive optical element. Thus, it is possible to obtain an image with a desired exposure state, regardless of the density error factor of the transmissive optical element.

Also, a configuration example in which an organic EC device is used as the light transmittance changeable element 504 was described as a transmissive optical element that is incorporated in the image capturing apparatus 500 and subjected to density error correction in the present embodiment. However, the present invention is not limited thereto, and may similarly be applied to a changeable ND filter with another method and a transmissive optical element other than a changeable ND filter, for example.

Also, the beam splitter 503 and the light transmittance changeable element 504 are configured by separate members in the present embodiment, but these may be integrated together. That is, for example, a glass portion on a front surface of the light transmittance changeable element 504 is made of an optical member having a beam splitter function, and thereby, the space can be reduced.

Sixth Embodiment

Next, a sixth embodiment of the present invention will be described. In the sixth embodiment, a second image for correction is acquired through time-division, instead of space-division. Hereinafter, the sixth embodiment will be described with reference to FIGS. 22 and 22B.

The above-described fifth embodiment has a configuration in which two types of images, that is, the first image obtained by imaging the luminous flux that has passed through the light transmittance changeable element 504 and the second image obtained by imaging the luminous flux that does not pass through a changeable ND filter are acquired by splitting the image capturing luminous flux into two using the beam splitter 503 In contrast, the sixth embodiment has a configuration capable of inserting/removing the light transmittance changeable element 504 into/from the image capturing optical axis in an image capturing apparatus 60X), and a first image and a second image are obtained from a single image sensor in a time-divisional manner.

Figure 22A:
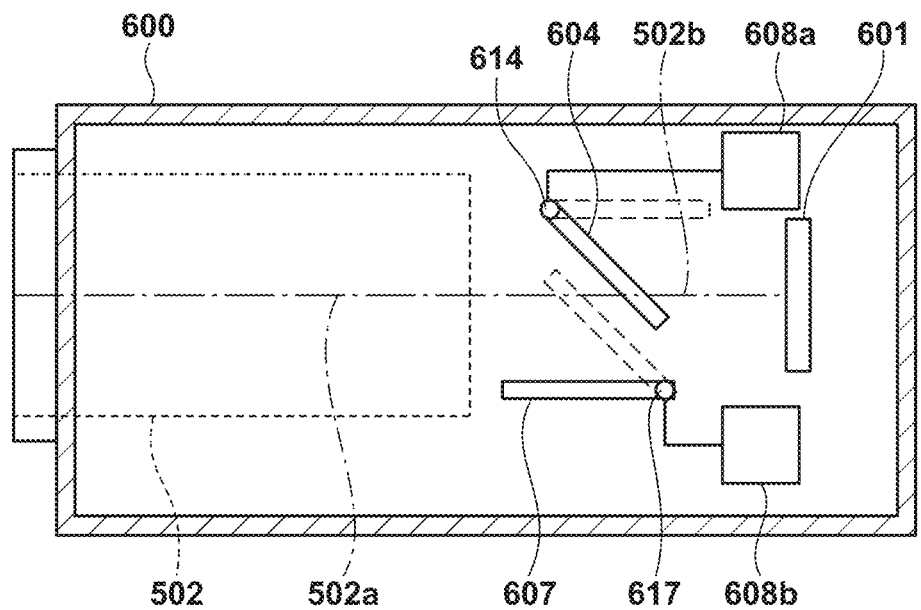
FIGS. 22A and 22B are schematic diagrams showing schematic configurations of an image capturing apparatus according to a sixth embodiment.
Figure 22B:
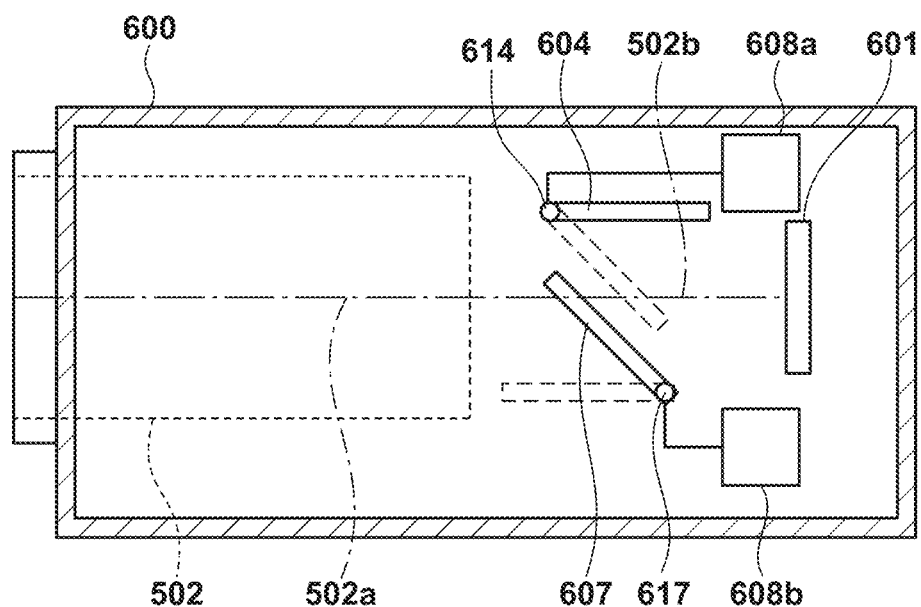

FIGS. 22A and 22B are schematic diagrams showing the schematic mechanical configuration of the image capturing apparatus 600 in the sixth embodiment. Note that members having the same functions as in the fifth embodiment shown in FIGS. 17A and 17B are given the same numbers in FIGS. 22A and 22B. In the image capturing apparatus 600 in the sixth embodiment, an image sensor 601 corresponds to a first image sensor 501a, a light transmittance changeable element 604 is arranged rotatably about an axis 614 as an approximate center, and a glass member 607 is arranged rotatably about an axis 617 as an approximate center. Also, reference numerals 608a and 608b represent motors that are driving members configured to rotate the light transmittance changeable element 604 and the glass member 607 via gears (not shown).

FIGS. 22A and 22B respectively show two types of rotation control states using the motors 608a and 608b. In the image capturing apparatus 600 in the sixth embodiment, the light transmittance changeable element 604 and the glass member 607 are controlled such that either one of the light transmittance changeable element 604 and the glass member 607 is in an inserted state in which the one is located on the image capturing optical axis, and the other is in a retracted state in which the other is not located on the image capturing optical axis.

The glass member 607 is a member for adjusting the light path length in the image capturing apparatus 200. The shape, material, and insertion position of the glass member 607 are adjusted and then the glass member 607 is arranged such that the light path length in the rotation control state as shown in FIG. 22B is equal to the light path length in the state in which the light transmittance changeable element 604 is inserted as shown in FIG. 22A. Accordingly, the image capturing apparatus 600 can capture an image in the same focal state in both states in which the light transmittance changeable element 604 is inserted and retracted.

With the above-described configuration, as shown in FIG. 22A, the image capturing apparatus 600 is capable of acquiring two types of images from the image sensor 601 in the state in which the light transmittance changeable element 604 is inserted as shown in FIG. 22A, and in the state in which the light transmittance changeable element 604 is retracted as shown in FIG. 22B. That is, it is possible to acquire the first image obtained by imaging the luminous flux that has passed through the light transmittance changeable element 604 and the second image obtained by imaging the luminous flux that does not pass through the light transmittance changeable element 604. Using the first image and the second image that were obtained in this manner makes it possible to correct an exposure error that is superimposed on the first image due to the density error of the light transmittance changeable element 604, using a method that is similar to the method described in the fifth embodiment.

Note that there is a possibility that, in the state in which the light transmittance changeable element 604 is retracted as shown in FIG. 22B, the second image is overexposed due to the imaging light amount being excessive and correction is not performed correctly. Thus, the second image may be captured in a state in which light is attenuated at a certain ratio using a fixed ND filter having a predetermined concentration instead of the glass member 607.

The configuration of this sixth embodiment has an advantage in that there is great potential for being able to reduce the space and the cost because a plurality of optical members such as the second image sensor 501b and the beam splitter 503 can be omitted, compared to the configuration of the fifth embodiment. On the other hand, the configuration of the fifth embodiment has an advantage of being suited for high-speed continuous correction processing because the first image and the second image can be acquired simultaneously, compared to the sixth embodiment. Thus, a better configuration may be selected and applied according to the purpose.

Note that the image capturing apparatuses that are shown in the first to sixth embodiments can be applied to products having a combination of light amount adjustment and an image sensor. For example, the image capturing apparatus can be used in a camera, a digital camera, a video camera, and a digital video camera, and also applied to products in which the image capturing apparatus is incorporated, such as a mobile phone, a smartphone, a PC, and a tablet. As in the present embodiment, there is an advantage that using the light transmittance changeable element constituted by an organic EC device and the like as a light-adjustment member makes it possible to change the light adjustment quantity using one filter, and delete the number of members and reduce the space.

Figure 23:
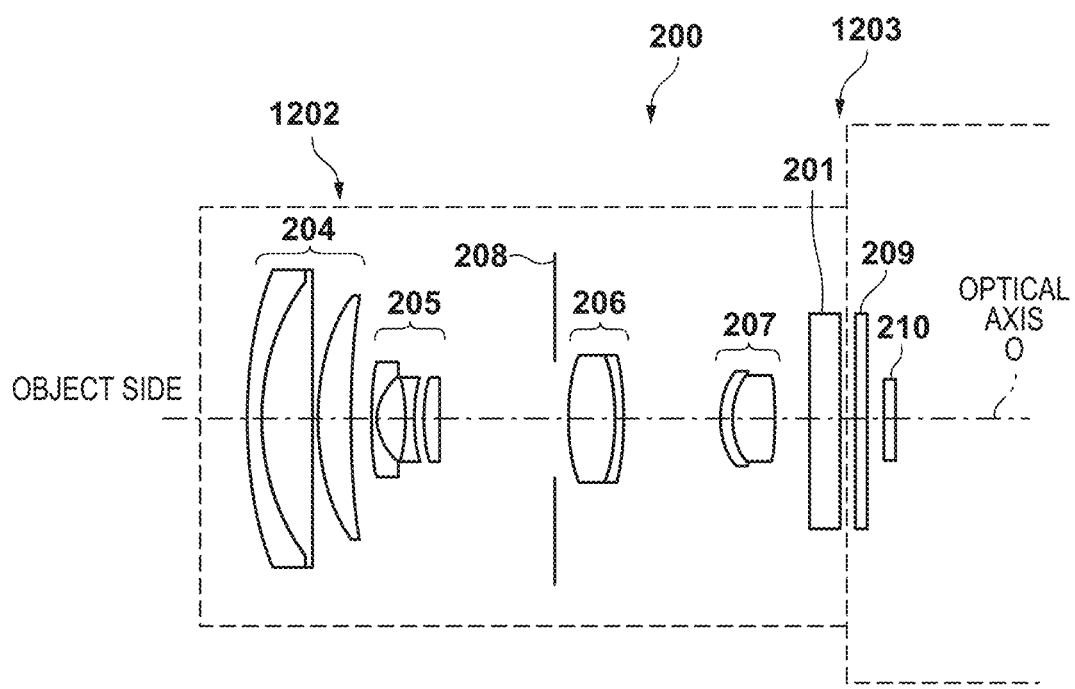
FIG. 23 is a schematic configuration diagram of a lens unit including a light transmittance changeable element according to a variation of the present invention.

The present invention can be applied to not only the configurations described in the first to sixth embodiments but also can be freely modified and applied within the scope of the gist thereof. For example, although the configuration in which the light transmittance changeable element 201 is provided inside a camera unit 1203 was described in the above-described embodiment, the control method described in the above-described embodiment may also be applied to a configuration in which a camera accessory that is detachable from the camera unit 1203 includes a light transmittance changeable element 201. FIG. 23 is a schematic configuration of a lens unit 1202 including a light transmittance changeable element 1201 according to a variation of the present invention. As shown in FIG. 23, for example, a configuration may also be adopted in which an inner portion of the camera accessory such as the lens unit 1202 or an adapter that is detachable from the camera unit 1203 includes the light transmittance changeable element 1201, the exposure control in the camera unit 203 and the transmittance control of this element are controlled by the camera unit 203. Also, if these camera accessories have a configuration including a CPU as the controller, and the like, the configuration may be adopted in which the CPU of the camera accessories controls the transmittance of the light transmittance changeable element 1202.

Other Embodiments

Note that the present invention may also be applied to a system constituted by a plurality of devices (for example, a host computer, an interface device, a scanner, and a video camera), or an apparatus (for example, a copying machine, or a facsimile machine) constituted by one device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-008163, filed on Jan. 22, 2018 which is hereby incorporated by reference herein in its entirety.

What is claimed is:

1. An image capturing apparatus comprising:
   an optical element that changes a transmittance of light;
   an image sensor that photoelectrically convert light that has passed through the optical element into an electric signal and outputs the electric signal as an image signal; and
   at least one processor or circuit that functions as following units:
      an acquisition unit that acquires information regarding a temperature of the optical element;
      a first control unit that controls a transmittance of the optical element; and
      a second control unit that controls exposure when a subject is captured using the image sensor and an image signal is output,
   wherein the acquisition unit acquires the information regarding the temperature by estimating a temperature at each of a plurality of points in a plane of the optical element based on a result obtained by measuring an ambient temperature of the optical element and a light amount incident on the optical element,
   wherein the first control unit performs control so as to increase a target transmittance of the optical element in a first condition under which a temperature of the optical element exceeds a predetermined temperature, based on the information regarding the temperature, and
   wherein the second control unit controls exposure excluding the transmittance according to a change in the transmittance of the optical element in the first condition.

2. The image capturing apparatus according to claim 1, wherein the first condition is a condition under which a temperature of at least a portion of the optical element exceeds the predetermined temperature.

3. The image capturing apparatus according to claim 1, further comprising:
   a photometry unit,
   wherein the second control unit is capable of controlling exposure including a shutter speed, an aperture, and a gain based on a photometric result obtained by the photometry unit, and controls at least one of the shutter speed, the aperture, and the gain such that a brightness does not change due to a change in the transmittance of the optical element, in the first condition, and
   wherein the photometry unit is implemented by one or more processors, circuitry or a combination thereof.

4. The image capturing apparatus according to claim 3, wherein the second control unit preferentially controls the gain according to a change in the transmittance of the optical element in the first condition.

5. The image capturing apparatus according to claim 1, wherein the optical element is an organic electrochromic device or a liquid crystal element.

6. An accessory that is attachable to and detachable from an image capturing apparatus including an image sensor, the accessory comprising:
   an optical element that changes a transmittance of light,
   wherein the image sensor is capable of photoelectrically converting light that has passed through the optical element into an electric signal and outputting the electric signal as an image signal, and
   exposure excluding the transmittance is controlled in accordance with a change in a target transmittance of the optical element in a first condition under which a temperature of the optical element which is acquired by estimating a temperature at each of a plurality of points in a plane of the optical element based on a result obtained by measuring an ambient temperature of the optical element and a light amount incident on the optical element exceeds a predetermined temperature.

7. A method for controlling an image capturing apparatus including an optical element that changes a transmittance of light, an image sensor that photoelectrically converts light that has passed through the optical element into electric signal and outputs the electric signal as an image signal, and an acquisition unit that acquire information regarding a temperature of the optical element, the method comprising:
   acquiring the information regarding the temperature by estimating a temperature at each of a plurality of points in a plane of the optical element based on a result obtained by measuring an ambient temperature of the optical element and a light amount incident on the optical element,
   performing control so as to increase a target transmittance of the optical element in a first condition under which a temperature of the optical element exceeds a predetermined temperature, based on the information regarding the temperature, and controlling exposure excluding the transmittance according to a change in the transmittance of the optical element in the first condition.

* * * * *